(12) United States Patent
Kostylev et al.

(10) Patent No.: US 7,023,009 B2
(45) Date of Patent: Apr. 4, 2006

(54) ELECTRICALLY PROGRAMMABLE MEMORY ELEMENT WITH IMPROVED CONTACTS

(75) Inventors: Sergey A. Kostylev, Bloomfield Hills, MI (US); Stanford R. Ovshinsky, Bloomfield Hills, MI (US); Wolodymyr Czubatyi, Warren, MI (US); Patrick Klersy, Lake Orion, MI (US); Boil Pashmakov, Troy, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 10/848,999

(22) Filed: May 19, 2004

(65) Prior Publication Data

US 2004/0256694 A1  Dec. 23, 2004

Related U.S. Application Data

(63) Continuation-in-part of application No. 09/276,273, filed on Mar. 25, 1999, now Pat. No. 6,969,866, which is a continuation-in-part of application No. 08/942,000, filed on Oct. 1, 1997, now abandoned.

(51) Int. Cl.
  *H01L 47/00*  (2006.01)
(52) U.S. Cl. .............................. 257/4; 257/5
(58) Field of Classification Search .................. 257/3, 257/4, 5; 438/95
  See application file for complete search history.

(56) References Cited

U.S. PATENT DOCUMENTS

| | | | | |
|---|---|---|---|---|
| 4,845,533 A | * | 7/1989 | Pryor et al. ..................... 257/4 |
| 5,854,102 A | * | 12/1998 | Gonzalez et al. ........... 438/237 |
| 5,998,244 A | * | 12/1999 | Wolstenholme et al. .... 438/128 |
| 6,337,266 B1 | * | 1/2002 | Zahorik ....................... 438/618 |

* cited by examiner

*Primary Examiner*—Phat X. Cao
(74) *Attorney, Agent, or Firm*—Philip H. Schlazer; Marvin S. Siskind

(57) ABSTRACT

An electrically operated memory element comprising a phase-change memory material, a first electrical contact and a second electrical contact. At least one of the electrical contact being a thin-film layer having a sidewall electrical coupled to the memory material.

25 Claims, 28 Drawing Sheets

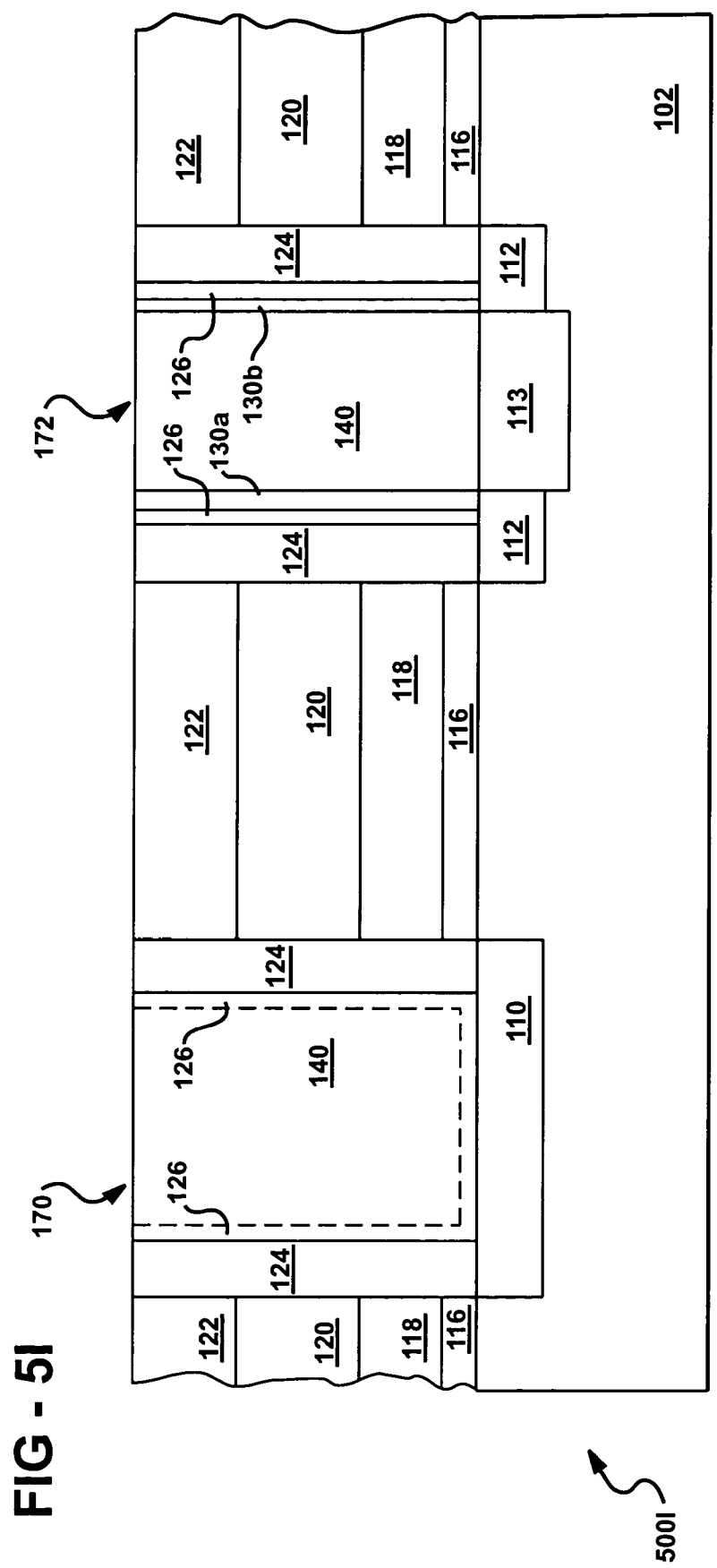

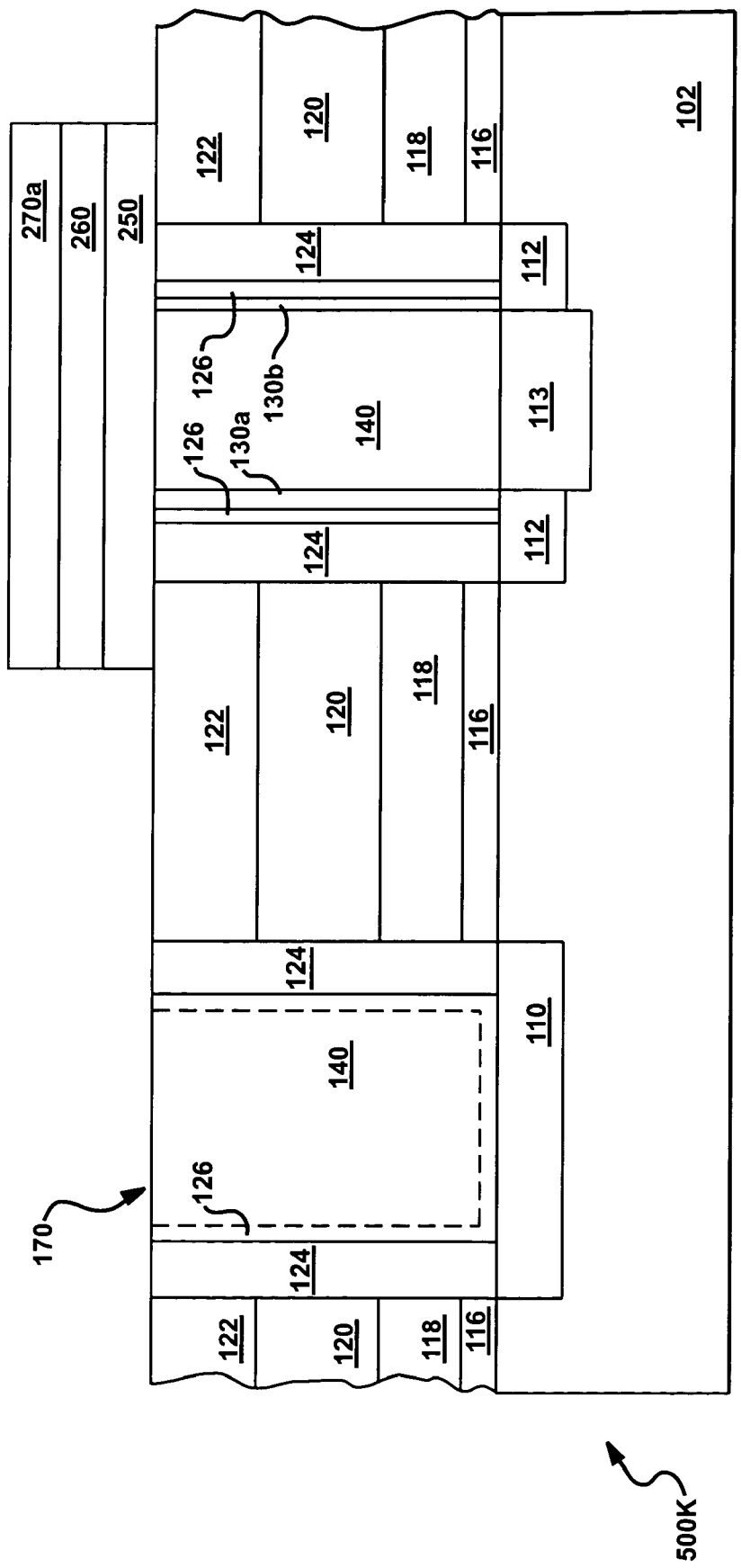

ELECTRICALLY PROGRAMMABLE MEMORY ELEMENT WITH IMPROVED CONTACTS

RELATED APPLICATION INFORMATION

The present application is a continuation-in-part of U.S. patent application Ser. No. 09/276,273, filed Mar. 25, 1999 now U.S. Pat. No. 6,969,866, which is a continuation-in-part of U.S. patent application Ser. No. 08/942,000, filed Oct. 1, 1997, now abandoned. U.S. patent application Ser. No. 09/276,273 is hereby incorporated by reference herein.

FIELD OF THE INVENTION

The present invention relates generally to an electrically operated memory element. More specifically, the present invention relates to an electrically operated memory element incorporating a phase-change memory material.

BACKGROUND AND PRIOR ART

The Ovonic EEPROM is a proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell).

The general concept of utilizing electrically writable and erasable phase change materials (i.e., materials which can be programmed between generally amorphous and generally crystalline states) for electronic memory applications is known in the art, as is disclosed, for example, in U.S. Pat. Nos. 3,271,591 and 3,530,441 to Ovshinsky both of which are assigned to the same assignee as the present invention, and both disclosures of which are incorporated herein by reference.

The early phase-change materials described in the '591 and '441 patents were based on changes in local structural order. The changes in structural order were typically accomodated by atomic migration of certain species within the material. Such atomic migration between the amorphous and crystalline states required a time necessary to accomodate the migration, thereby making the programming times and programming energies relatively high.

The relatively slow (by present standards) programming speed, particularly when programmed in the direction of greater local order (in the direction of increasing crystallization), and the relatively high input energy needed to initiate a change in local order where limitations which prevented the memory cells described in the '591 and '441 patents from widespread use as a direct and universal replacement for present computer memory applications, such as tape, floppy disks, magnetic or optical hard disk drives, solid state disk flash, DRAM, SRAM, and socket flash memory.

The most significant of these limitations was the relatively high energy input required to obtain detectable changes in the chemical and/or electronic bonding configurations of the chalcogenide material in order to initiate a detectable change in local order. The electrical energy required to switch these materials typically measured in the range of about a microjoule. It should be noted that this amount of energy must be delivered to each of the memory elements in the solid state matrix of rows and columns of memory cells. Such high energy levels translate into high current carrying requirements for the address lines and for the cell isolation/address device associated with each discrete memory element.

Low programming energy is especially important when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the operating time of the computer per charge of the power cells. However, if the EEPROM replacement for mechanical hard drives has high switching energy requirements (and therefore high power requirements), the power savings may be inconsequential or at best unsubstantial. Therefore, any EEPROM which is to be considered a universal memory requires low programming energy.

Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state).

Electrical phase change materials and memory cells having decreased electrical switching times and programming energies are described in commonly assigned U.S. Pat. No. 5,166,758 to Ovshinsky, the disclosure of which is incorporated by reference herein. Other examples of electrical phase change materials and memory cells are provided in commonly assigned U.S. Pat. Nos. 5,296,716, 5,414,271, 5,359,205, 5,341,328, 5,536,947, 5,534,712, 5,687,112, and 5,825,046 the disclosures of which are all incorporated by reference herein. Still further examples of electrical phase change materials and memory cells are provided in commonly assigned U.S. patent application Ser. Nos. 08/878,870, 09/102,887, and 08/942,000 all of which are incorporated by reference herein.

Generally, the disclosed phase change materials can be electrically switched between structural states of generally amorphous and generally crystalline local order. The materials may also be electrically switched between different detectable states of local order across the entire spectrum between completely amorphous and completely crystalline states. That is, the switching of such materials is not required to take place between completely amorphous and completely crystalline states but rather can be switched in incremental steps reflecting either (1) changes of local order, or (2) changes in volume of two or more materials having different local order so as to provide a "gray scale" represented by a multiplicity of conditions of local order spanning the spectrum between the completely amorphous and the completely crystalline states. The phase change materials exhibit different electrical characteristics depending upon its state. For example, in its amorphous state the material exhibits a higher electrical resistivity than it does in its crystalline state.

The phase-change materials are truly non-volative and will maintain the integrity of the information stored by the memory cell without the need for period refresh signals. As well, the subject materials are preferably directly overwritable so that they can be set to directly to one of a plurality of resistance values without the need to be set to a specific starting or erased resistance value, regardless of the previous resistance value of the material in response to a selected electrical input signal. Furthermore, the phase change materials preferably have a large dynamic range which provide for gray scale storage of multiple bits of binary information in a single cell by mimicking the binary encoded information in analog form and thereby storing multiple bits of binary encoded information as a single resistance value in a single cell.

SUMMARY OF THE INVENTION

Disclosed herein is an electrically operated, directly overwritable, single-cell memory element, comprising: a phase-change memory material; a first electrical contact, the first contact being a first thin-film layer having a sidewall electrically coupled to the memory material; and a second electrical contact electrically coupled to the memory material, the second contact spacedly disposed from the first electrical contact.

Also disclosed herein is an electrically programmable memory element, comprising: a phase-change memory material; a first conductive layer in electrical communication with the memory material, essentially all of the communication between the first conductive layer and the memory material occurring through a sidewall of the first conductive layer.

Also disclosed herein is a method of making an electrically programmable memory element, comprising: providing a first dielectric layer; forming a first conductive layer over the first dielectric layer; forming a second dielectric layer over the first conductive layer; and introducing a phase-change memory material electrically coupled to a sidewall of the first conductive layer.

DETAILED DESCRIPTION OF THE INVENTION

Figure 1:
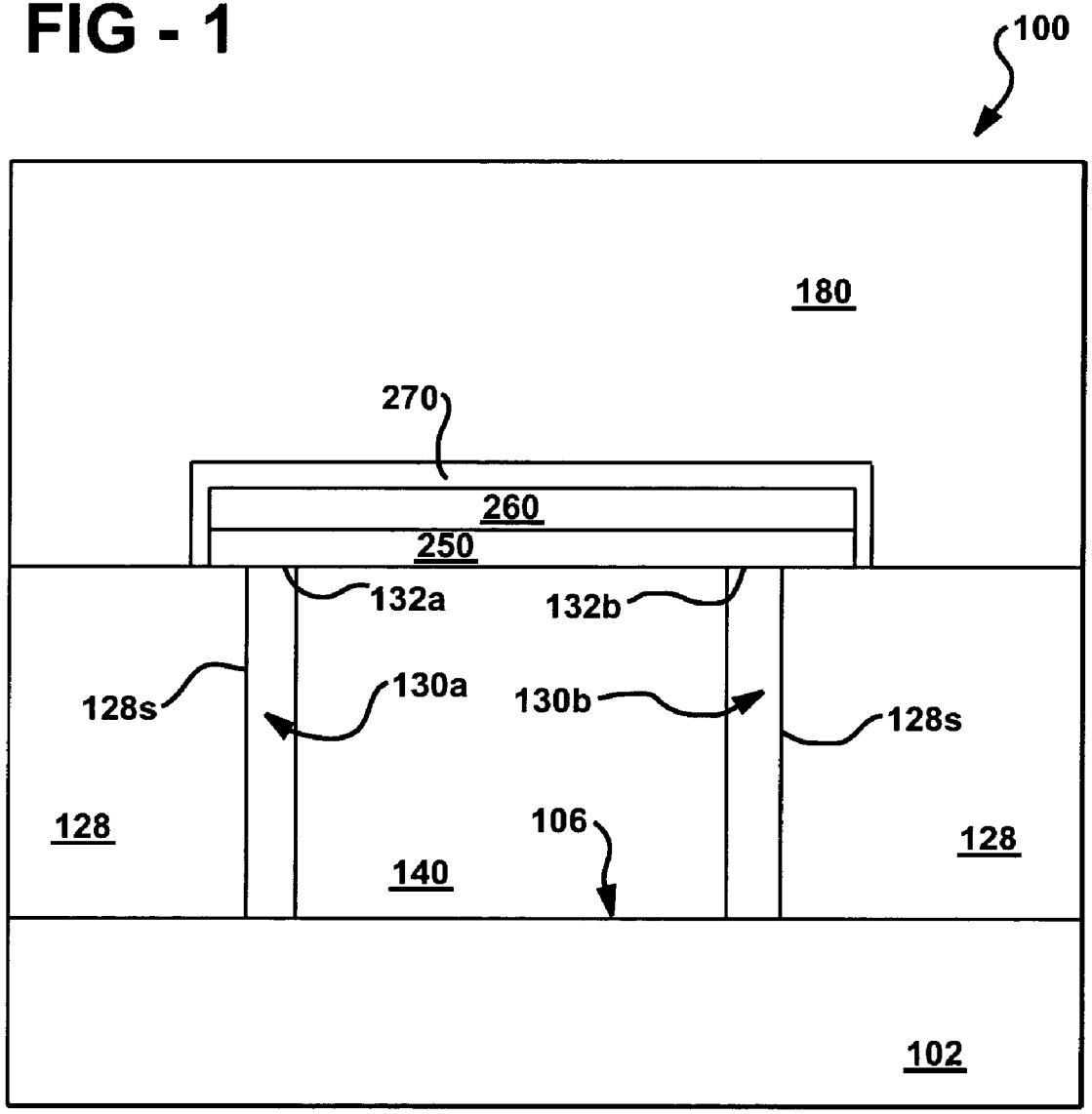
FIG. 1 is cross-section view of a memory device of the present invention comprising conductive sidewall spacers.

FIG. 1 is a cross-sectional view of a memory device 100 of the present invention formed on a semiconductor substrate 102. The memory device 100 comprises two independent single-cell memory elements. The first single-cell memory element comprises a first contact 130A, memory material layer 250, and second contact 270. The second single-cell memory element comprises first contact 130B, memory material layer 250, and second contact 270. As shown in the embodiment shown in FIG. 1, two memory elements may share a single continuous volume of phase change memory material. The insulative layer 260 provides for electrical isolation between the memory material 250 and the horizontally disposed section of the second contact 270. The insulative layer 260 also provides a thermal blanket keeping heat energy within the memory material layer 250. The dielectric region 140 electrically isolates the first contact 130A from the first contact 130B. The first contacts 130A,B and the second contact 270 supply an electrical signal to the memory material. Upper dielectric region 180 is deposited on top of the memory device 100. Preferably, the upper dielectric layer 180 comprises borophosphosilicate glass (BPSG).

In the embodiment shown, the first contacts 130A,B are conductive sidewall spacers (also referred to herein as "conductive spacers") formed along the sidewall surfaces 128S of the dielectric regions 128. (Sidewall surfaces 128S and surface 106 form a trench extending pependicular to the plane of the illustration).

In the specific configuration depicted, the volume of memory material is a planar memory material layer 250 that is substantially horizontally disposed and positioned above the conductive sidewall spacers 130A,B so that the bottom surface of the memory layer 250 is adjacent to the top of each of the conductive spacers 130A,B (where "top" is defined relative to the substrate).

Preferably, the memory material is adjacent to an edge of the conductive sidewall spacer. In the embodiment shown in FIG. 1, the memory layer 250 is adjacent to the edges 132A,B of the conductive spacers 130A,B, respectively. In the embodiment shown, the edges 132A,B are lateral cross-sections of the conductive spacers 130A,B.

The area of contact between the memory material and the conductive spacers 130A,B is the area of contact between the memory material and the edges 132A,B. Hence, the only electrical coupling between the memory material and the conductive spacers 130A,B is through all or a portion of the edges 132A,B. The remainder of the conductive spacers 130A,B is electrically isolated from the memory material by dielectric regions 128 and 140.

The memory elements of the present invention may be electrically coupled to isolation/selections devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Figure 2:
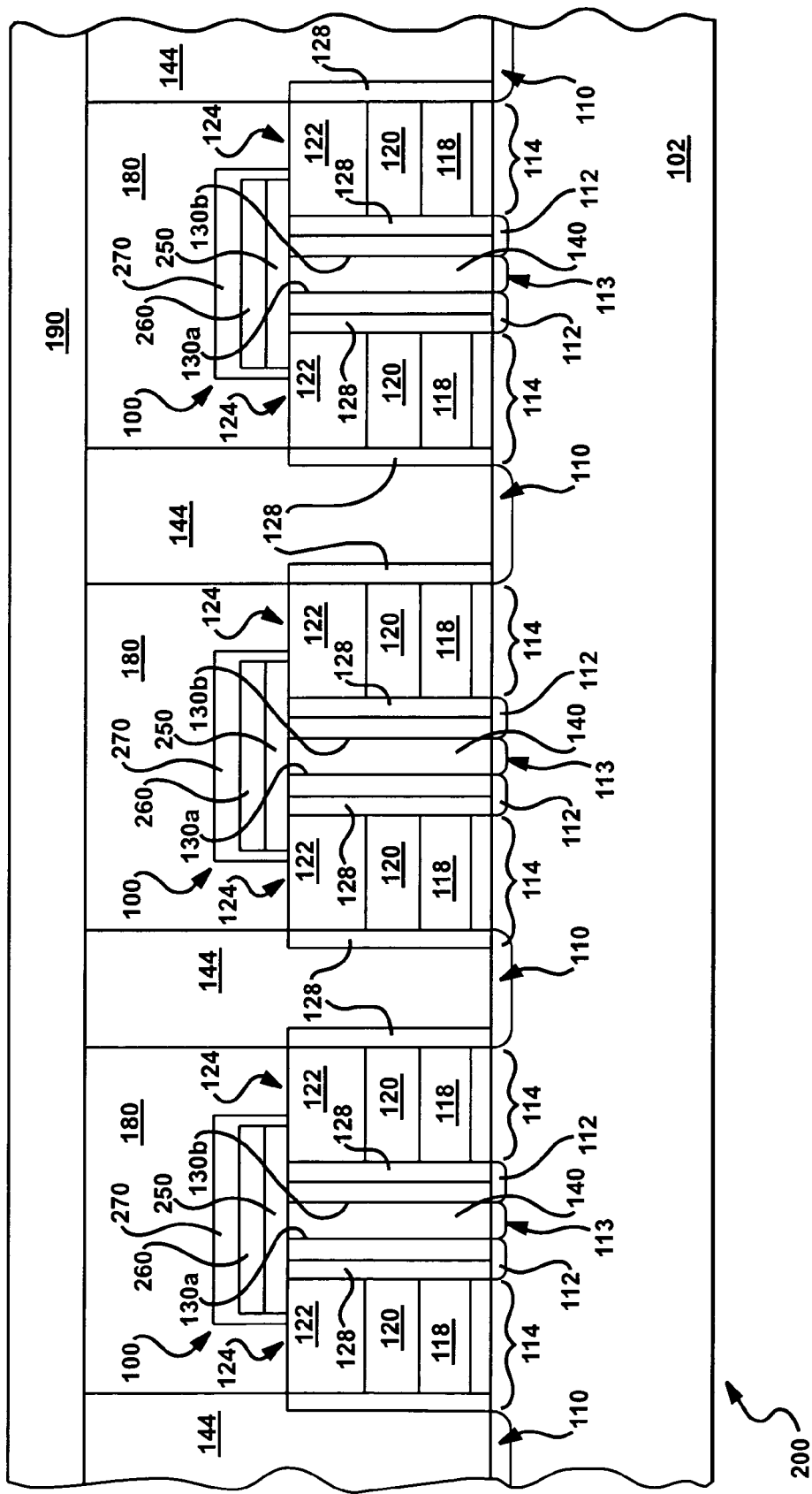
FIG. 2 is a cross-sectional view of a memory array of the present invention, parallel to the channel length, comprising conductive sidewall spacers.

FIG. 2 is a cross-sectional view of a memory array structure 200 comprising the memory device 100 described above. Each of the memory elements of memory device 100 is electrically coupled to a selection/isolation device which is in the form of an NMOS transistor. The memory array 200 may be formed on a single crystal silicon semiconductor wafer 102 which is p-doped and which forms a p-substrate for the deposition of the remaining elements of the configuration illustrated.

The NMOS transistors include n-doped source regions 110, n-doped drain regions 112, and gate regions 118. The source regions 110 and the drain regions 112 may comprise more than one portion of n-doped material, namely a lightly doped n− portion and a more heavily doped n+ portion.

The n-doped source regions 110 and drain regions 112 are separated by channel regions 114. The gate regions 118, formed above the channel regions 114, control the flow of current from the source regions to the drain regions through the channel regions 114. The gate regions 118, preferably comprise a layer of polysilicon. Separating the gate regions 118 from the channel regions 114 are dielectric regions 116 which are preferably layers of silicon dioxide.

Associated with the channel regions 114 is a "channel length" and a "channel width". The channel length is the distance between source and drain regions. The channel length is oriented parallel to the current flow between the two regions, which is parallel to the plane of the illustration of FIG. 2. The "length" of the memory array is the dimension of the array parallel to the channel length.

Figure 3:
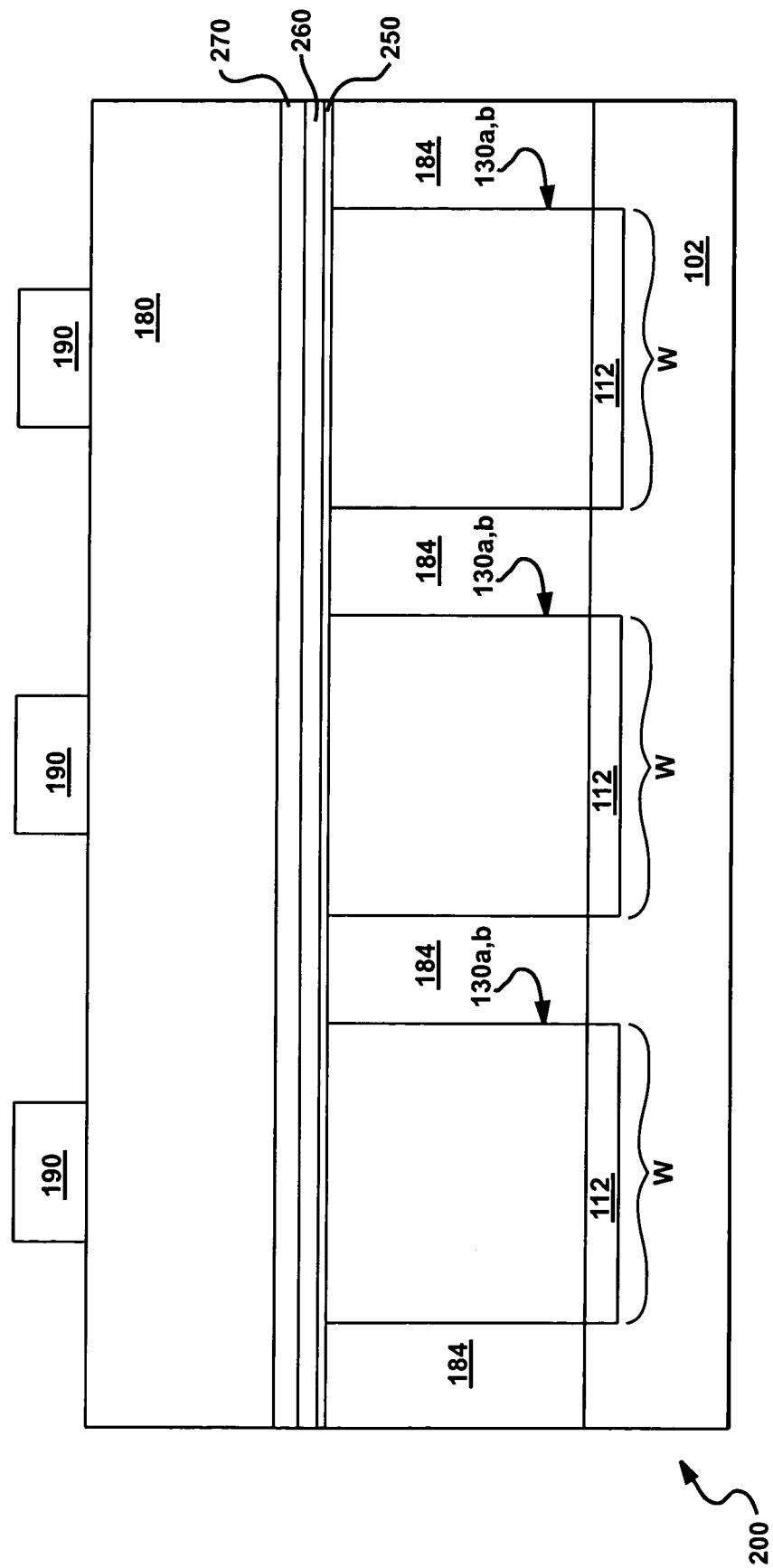
FIG. 3 is a cross-sectional view of a memory array of the present invention, parallel to the channel width, comprising conductive sidewall spacers.

The channel width is perpendicular to the channel length and is thus perpendicular to the plane of the illustratin of FIG. 2. The "width" of the memory array is the dimension of the array parallel to the channel width. FIG. 3 is a cross-sectional view of the memory array structure 200 parallel to the channel width. The view shows a plurality of conductive sidewall spacers which are electrically isolated from each other by dielectric regions 184, along the width of the memory array.

Referring again to FIG. 2, channel stop regions 113 are formed in the n-doped drain regions 112 creating two neighboring, electrically isolated drain regions 112 for separate NMOS transistors. Generally, the channel stop regions 113 have a conductivity type opposite that of the source and drain regions 110, 112. In the NMOS environment shown, the channel stop regions 113 comprises p-doped silicon. The channel stop regions 113 may be formed by the implantation of boron ions using well known ion implantation techniques.

Formed above the gate regions 118 are metal regions 120 which preferably comprise a layer of tungsten silicide. Metal regions 120 are used to deliver the electrical signal to the gate regions 118. The metal regions 120 extend across the width of the memory array structure (parallel to the channel width), perpendicular to the plane of the illustration of FIG. 2 and form a first set of addressing lines, in this case the x set of an x-y grid for addressing the individual memory elements of the array.

Formed above the metal regions 120 are the dielectric regions 122 preferably comprising a layer of silicon dioxide. The dielectric regions 122 electrically insulates the metal regions 120 from neighboring regions of the memory device. The stack of layers 114, 116, 118, 120 are collectively referred to as the gate stacks 124. Dielectric regions 128 are formed on the sidewall surfaces of the gate stacks 124.

Metal lines 190 are formed on top of the upper insulation regions 180 and extend across the length of the memory array structure (parallel to the channel length), parallel to the plane of FIG. 2. Metal lines 190 form a second set of addressing lines, in this case the y set of an x-y grid for addressing the individual memory cells of the array. The metal lines 190 may be formed from a conductive material such as aluminum or copper. Tungsten plugs 144 electrically connect the metal lines 190 to the drain regions 110. It is noted that in the particular embodiment shown in FIG. 2, each of the tungsten plugs 144 is shared by two NMOS transistors. A layer of titanium silicide (not shown) may be formed on the surface of the silicon substrate to improve the conductivity between the substrate 102 and the conductive sidewall spacers 130a,b as well as between the substrate 102 and the conductive plugs 144.

Hence, associated with each memory element of the memory array structure is isolation/addressing device which serves as an isolation/addressing device for that memory element thereby enabling that cell to be read and written without interfering with information stored in other adjacent or remote memory elements of the array. In the embodiment shown in FIG. 2, the isolation/addressing device is an NMOS device.

Referring to FIG. 2, the electrical coupling between the memory material 250, first contact 130A,B, second contact 270, isolation transistor, and addressing lines may be summarized as follows. The NMOS transistor gate (gate region 118) is electrically connected to an x-addressing line (metal region 120), the transistor drain (drain region 110) is electrically connected to a y-addressing line (metal line 190 via conductive plug 144), the transistor source (source region 112) is electrically connected to one terminal of a memory element (first contact 130A or 130B). The other terminal of the memory device (second contact 270) is electrically coupled to a voltage source Va (not shown in FIG. 2).

Figure 4:
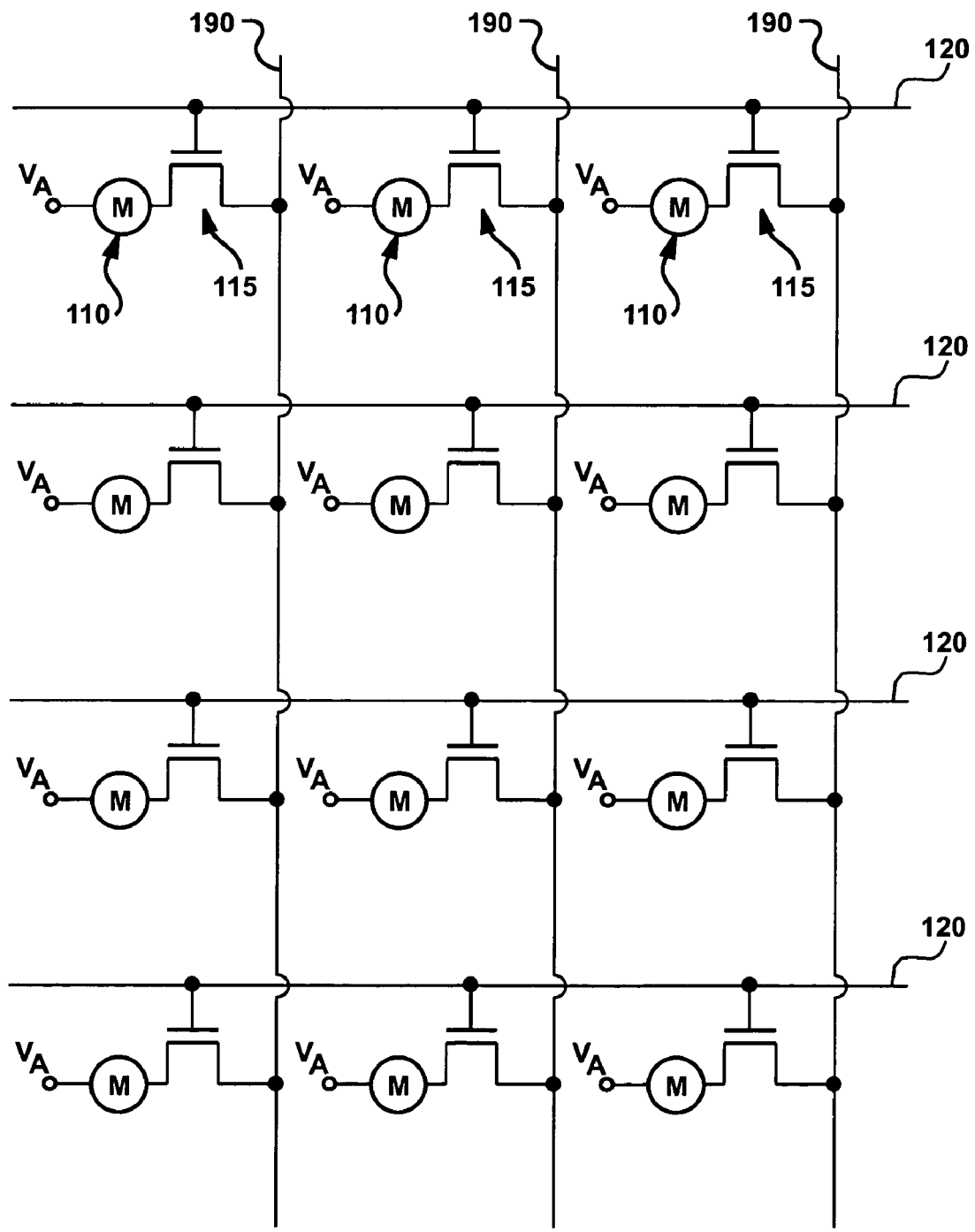
FIG. 4 is a schematic diagram of a memory array of the present invention.

FIG. 4 is a schematic diagram of the memory array illustrating the electrical connections between each of the memory elements 110, a corresponding field-effect-transistor (FET) 115, and the X,Y adressing lines 120, 190 that are used to selectively set and read the individual memory elements. The FET is preferably a MOSFET, and more preferably an NMOS transistor. Alternately, the MOSFET may be a PMOS. It is noted that the x and y addressing lines are connected to external circuitry in a manner well known to those skilled in the art.

As shown in the schematic diagram, the gate of the FET transistor is connected to one of the addressing lines. In the embodiment described above, the drain is connected to a second addressing line. However, in an alternate embodiment, source of the transistor may instead be connected to the second addressing line.

Figure 5A:
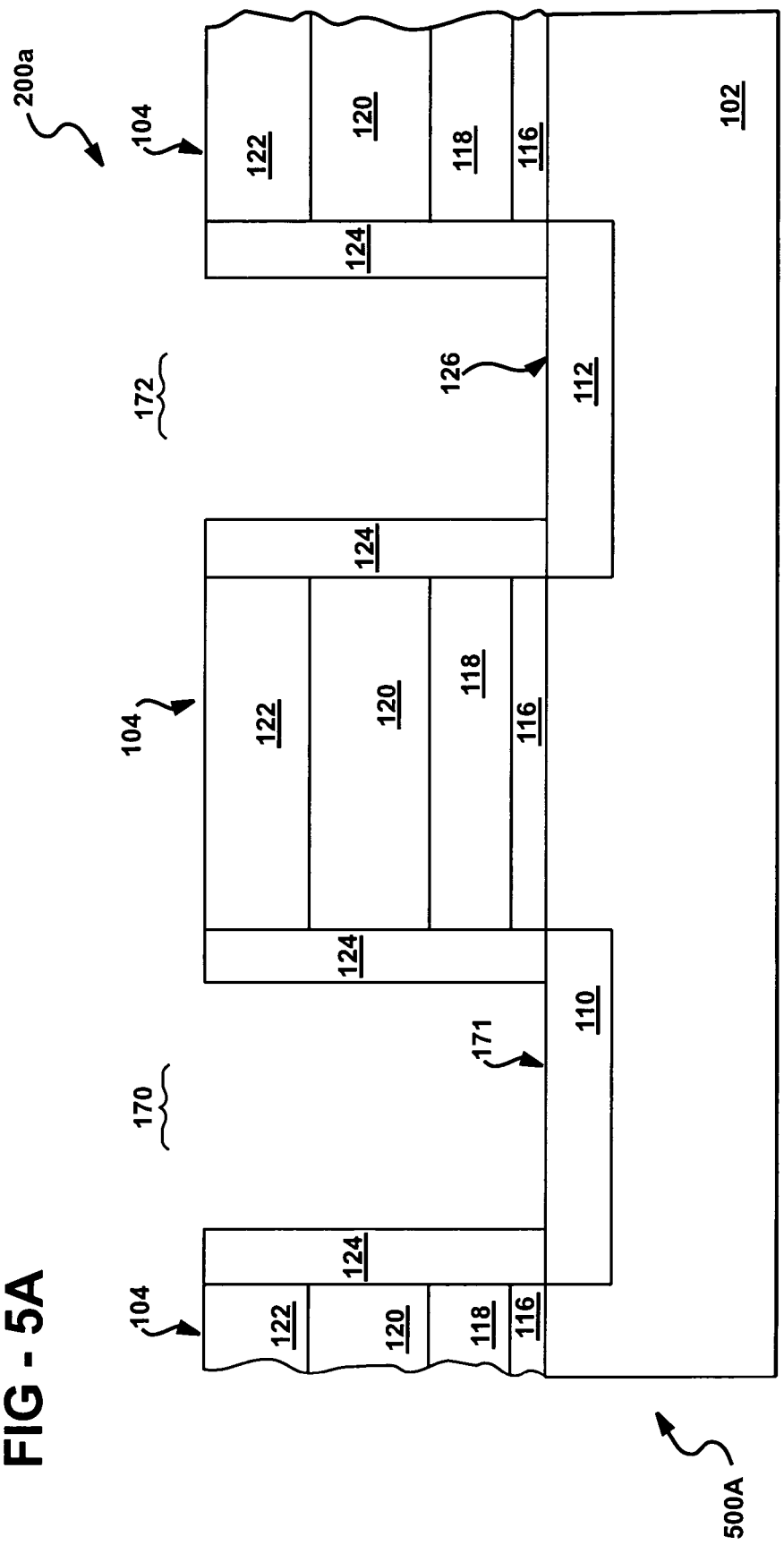
FIGS. 5A through 5O show schematic cross-sectional views for the sequence of process steps for fabricating the memory array of the present invention.
Figure 5B:
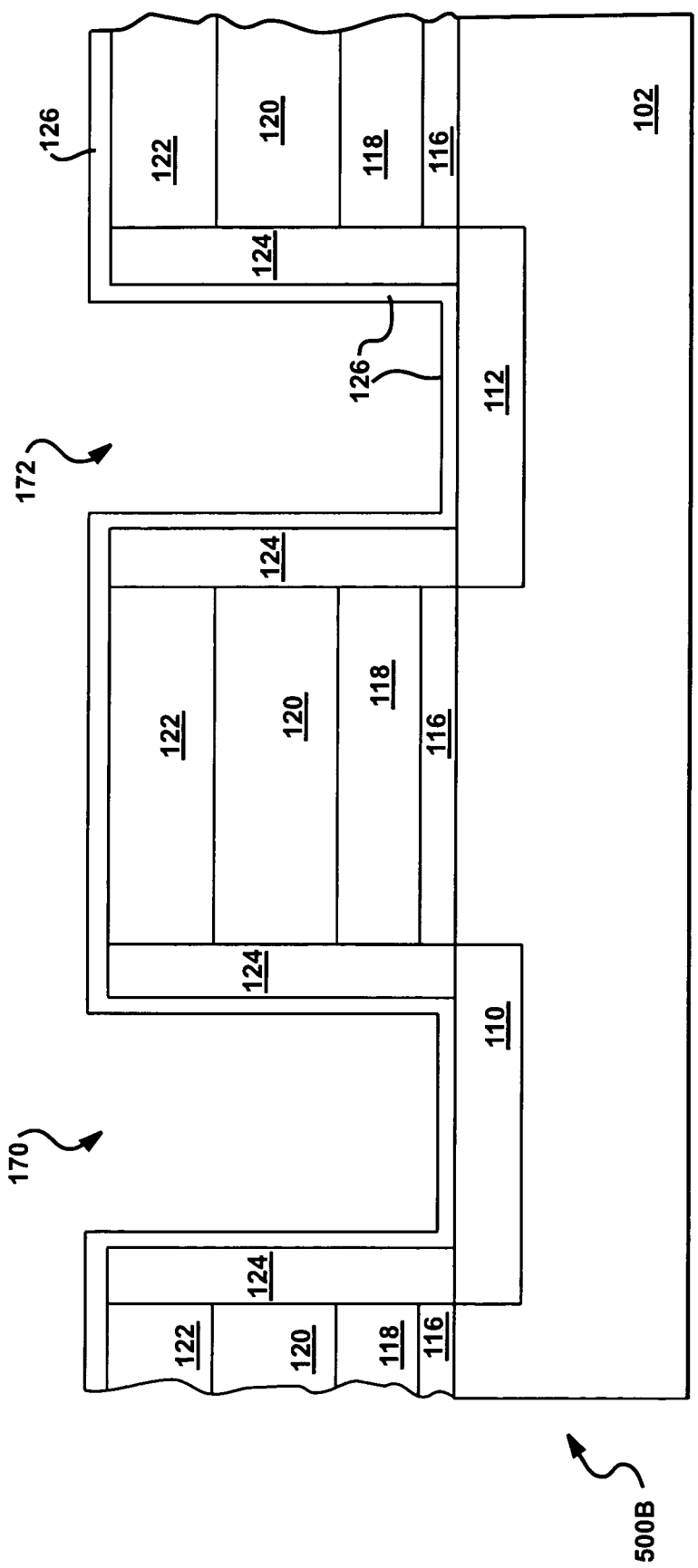
Figure 5C:
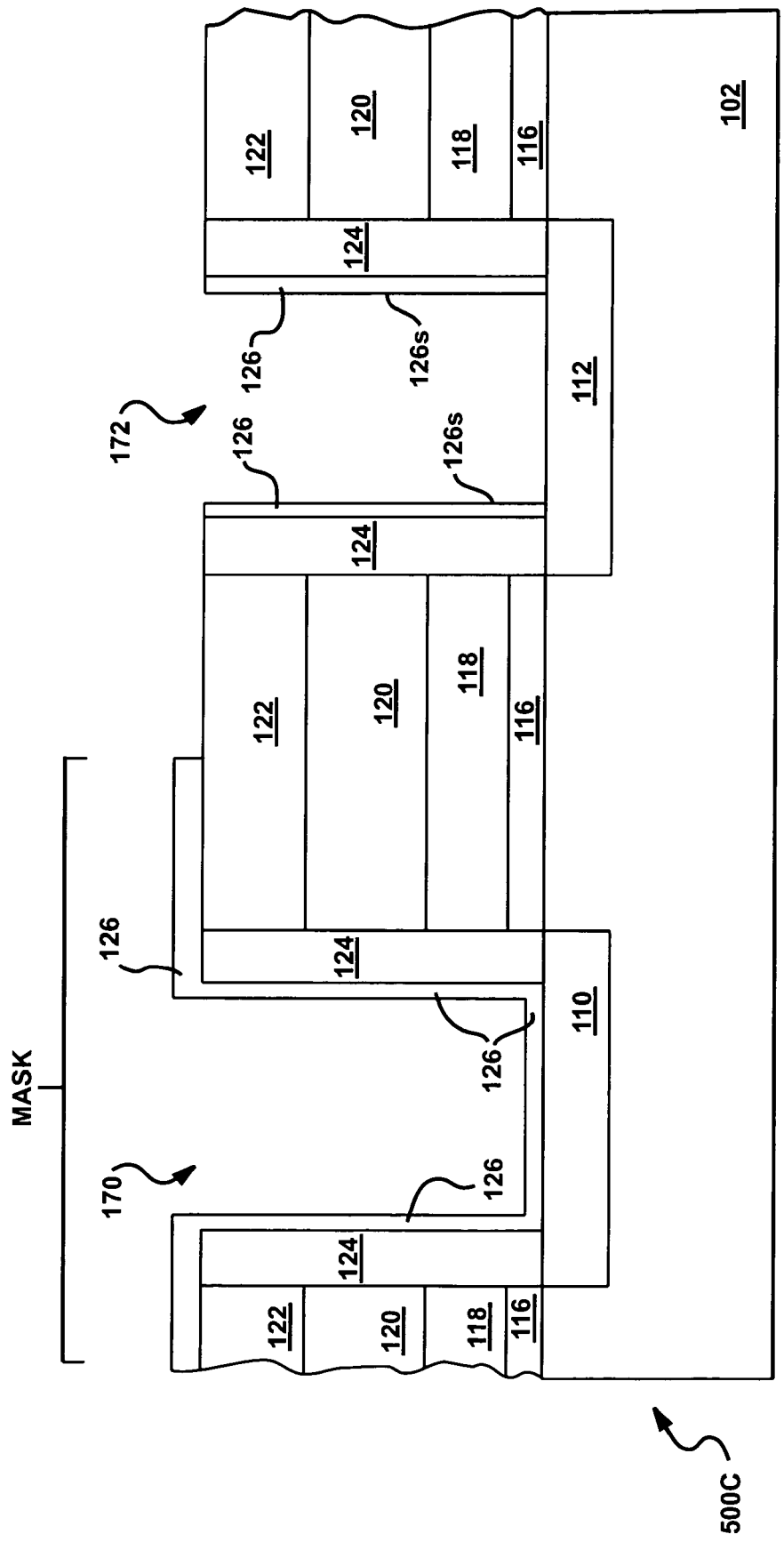
Figure 5D:
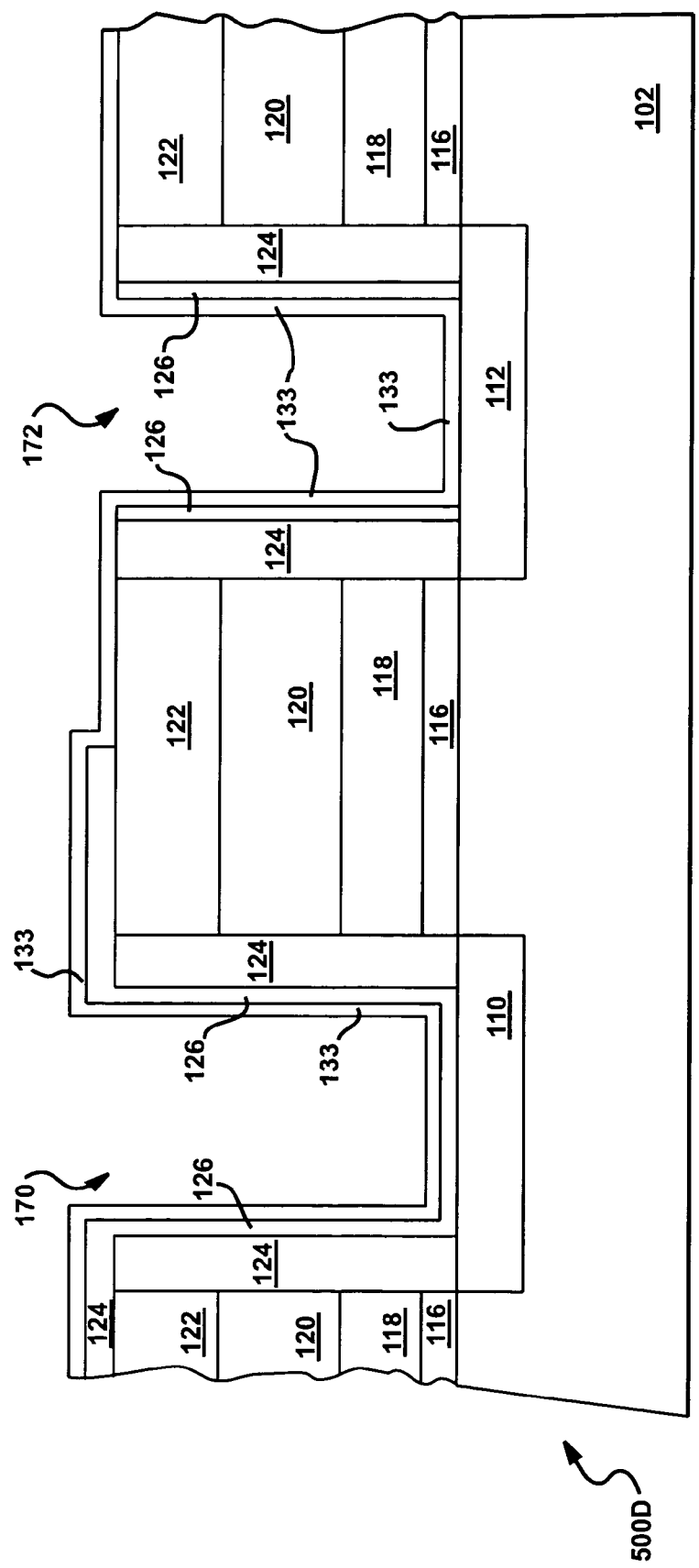
Figure 5E:
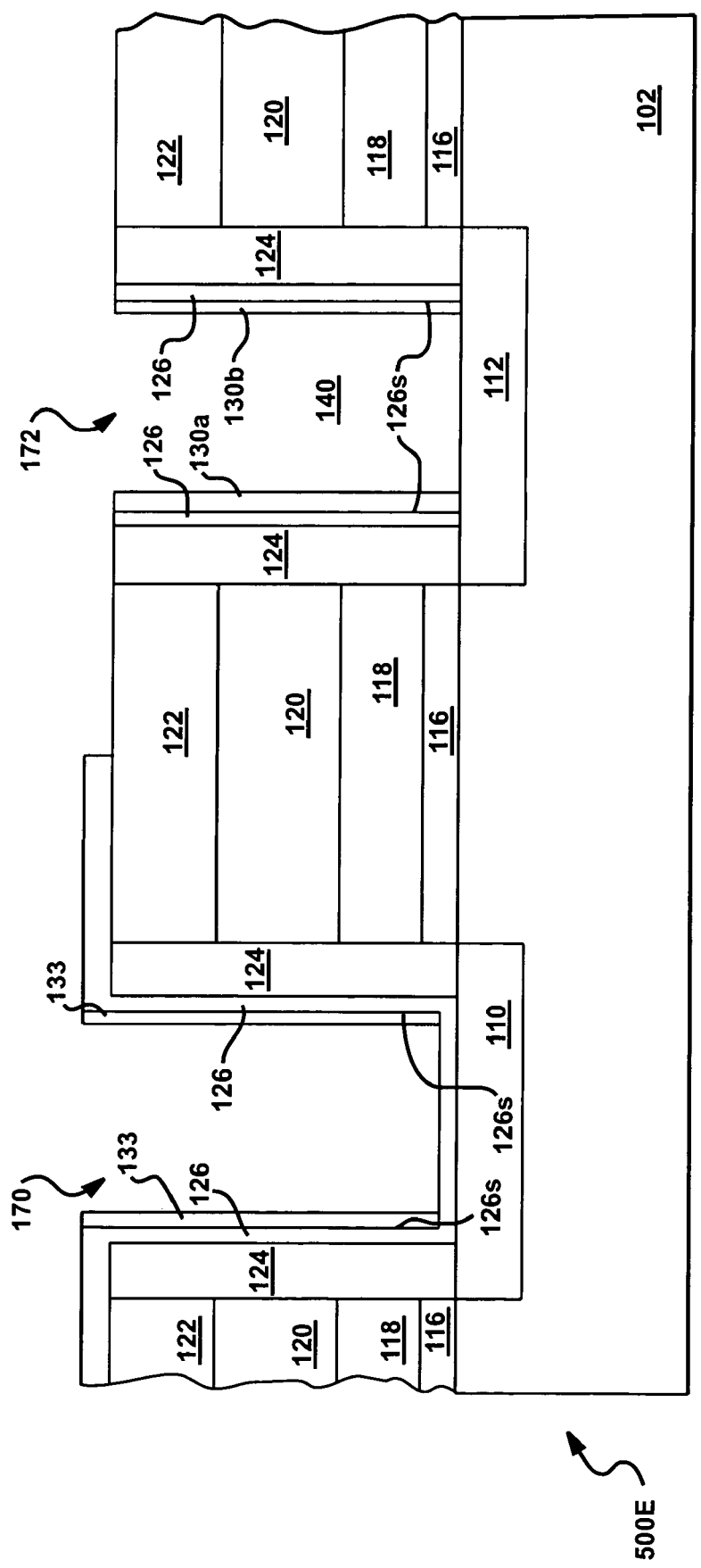
Figure 5F:
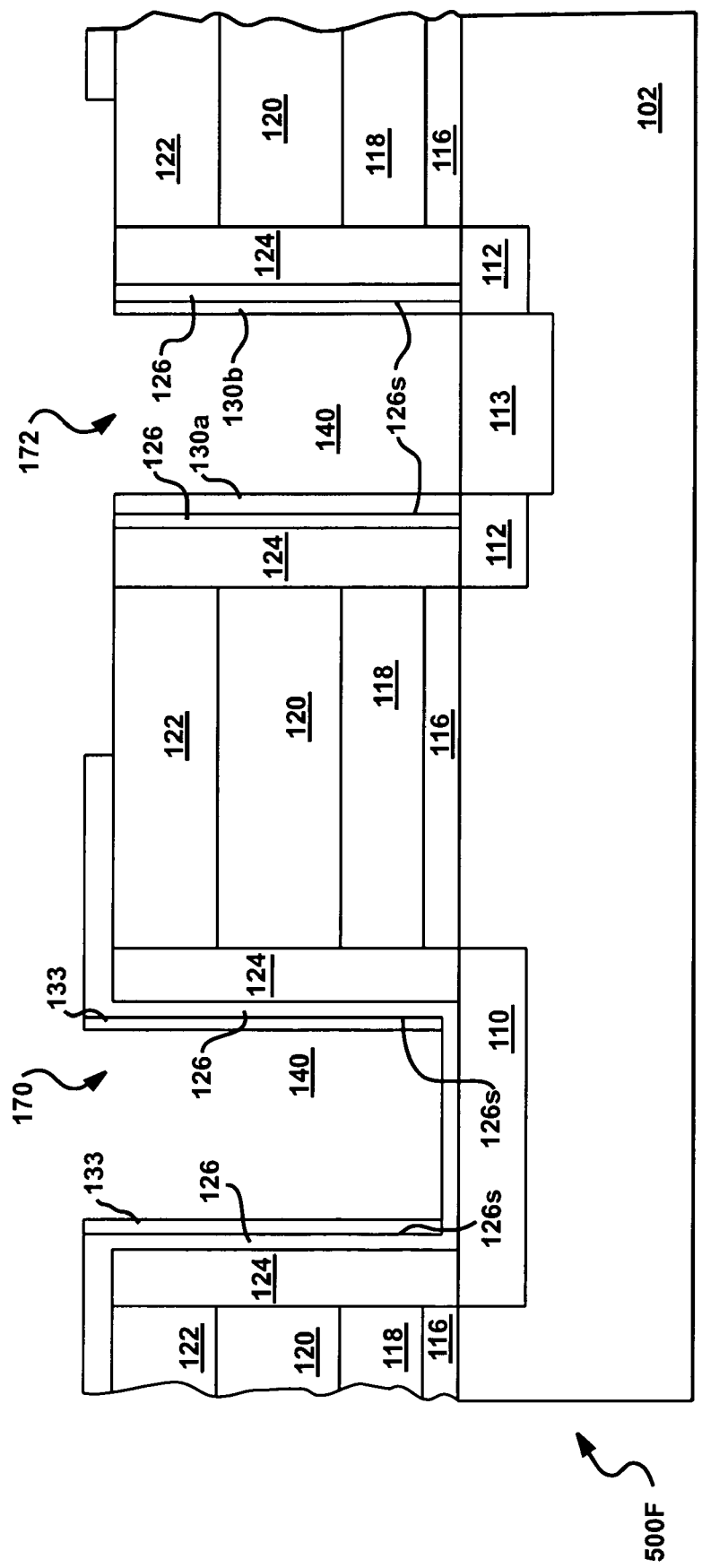
Figure 5G:
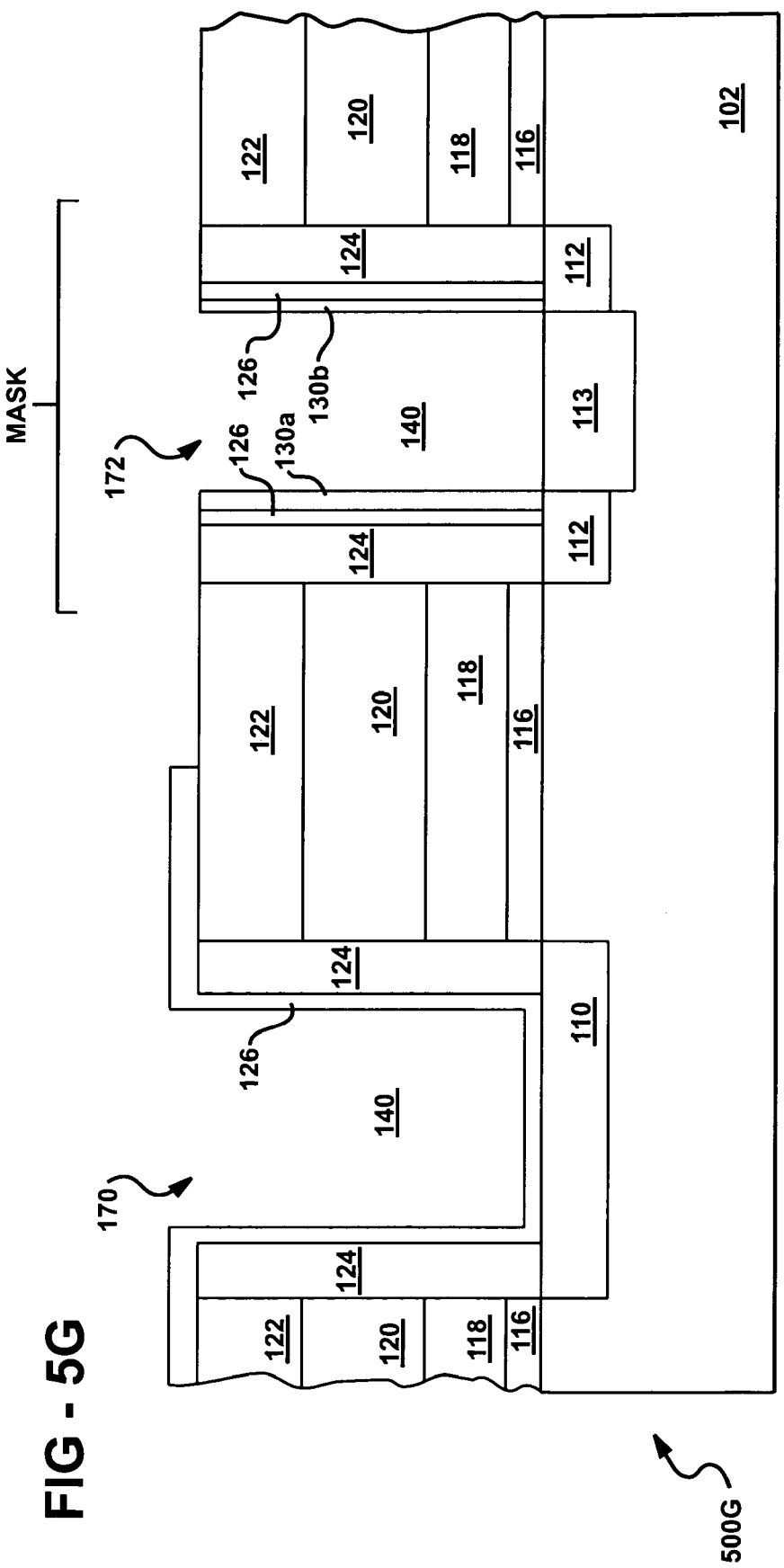
Figure 5H:
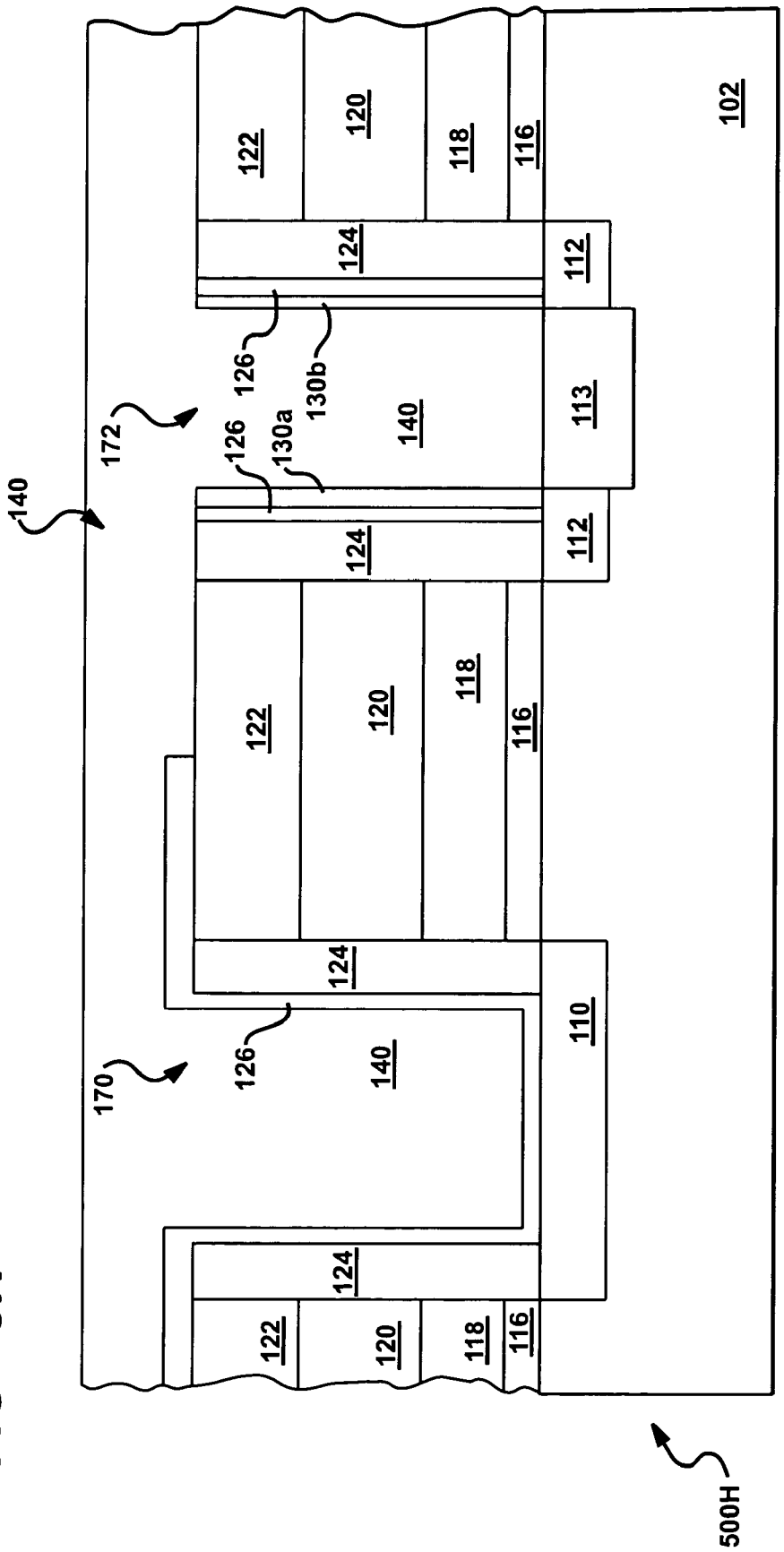
Figure 5J:
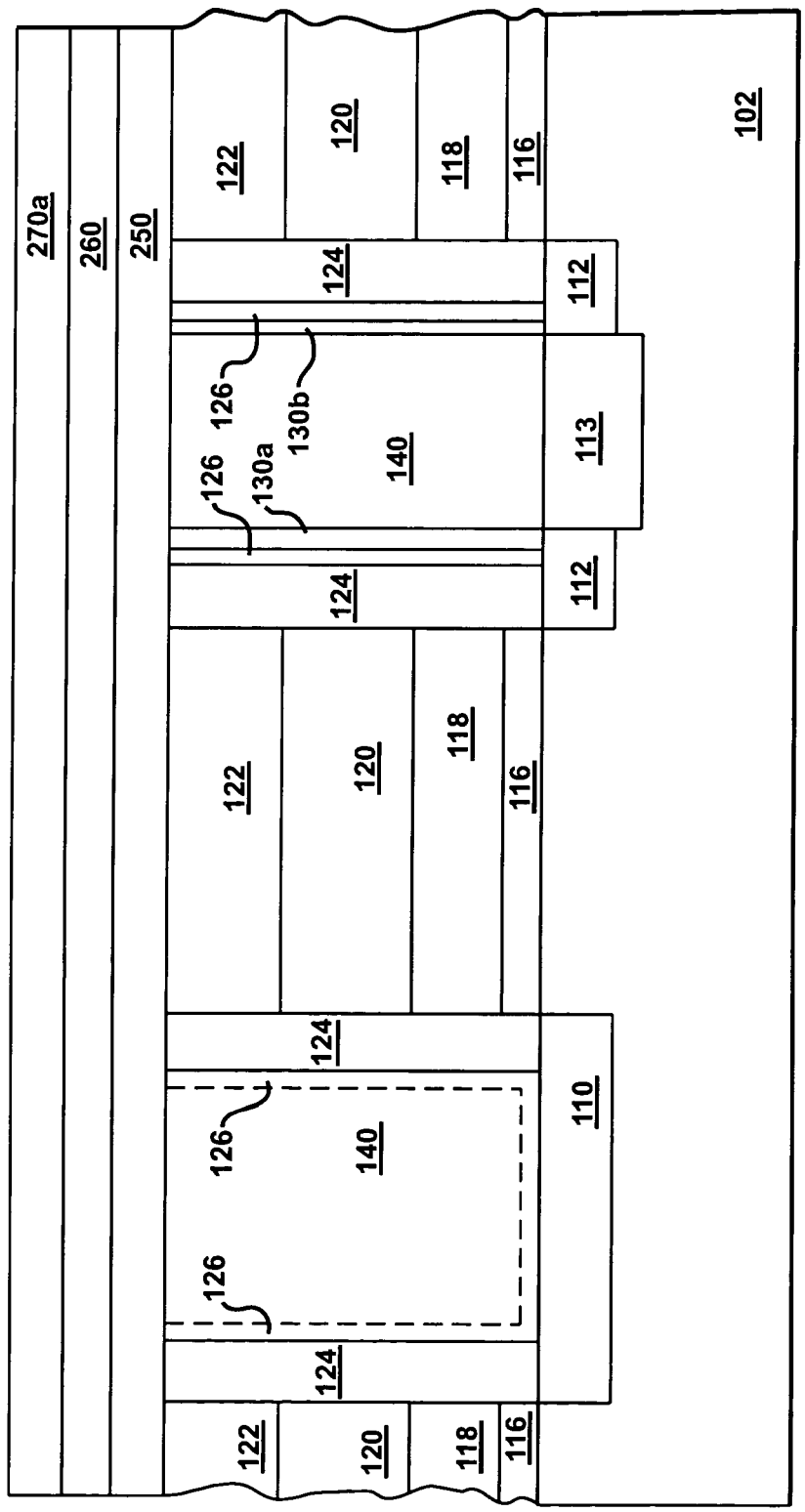
Figure 5L:
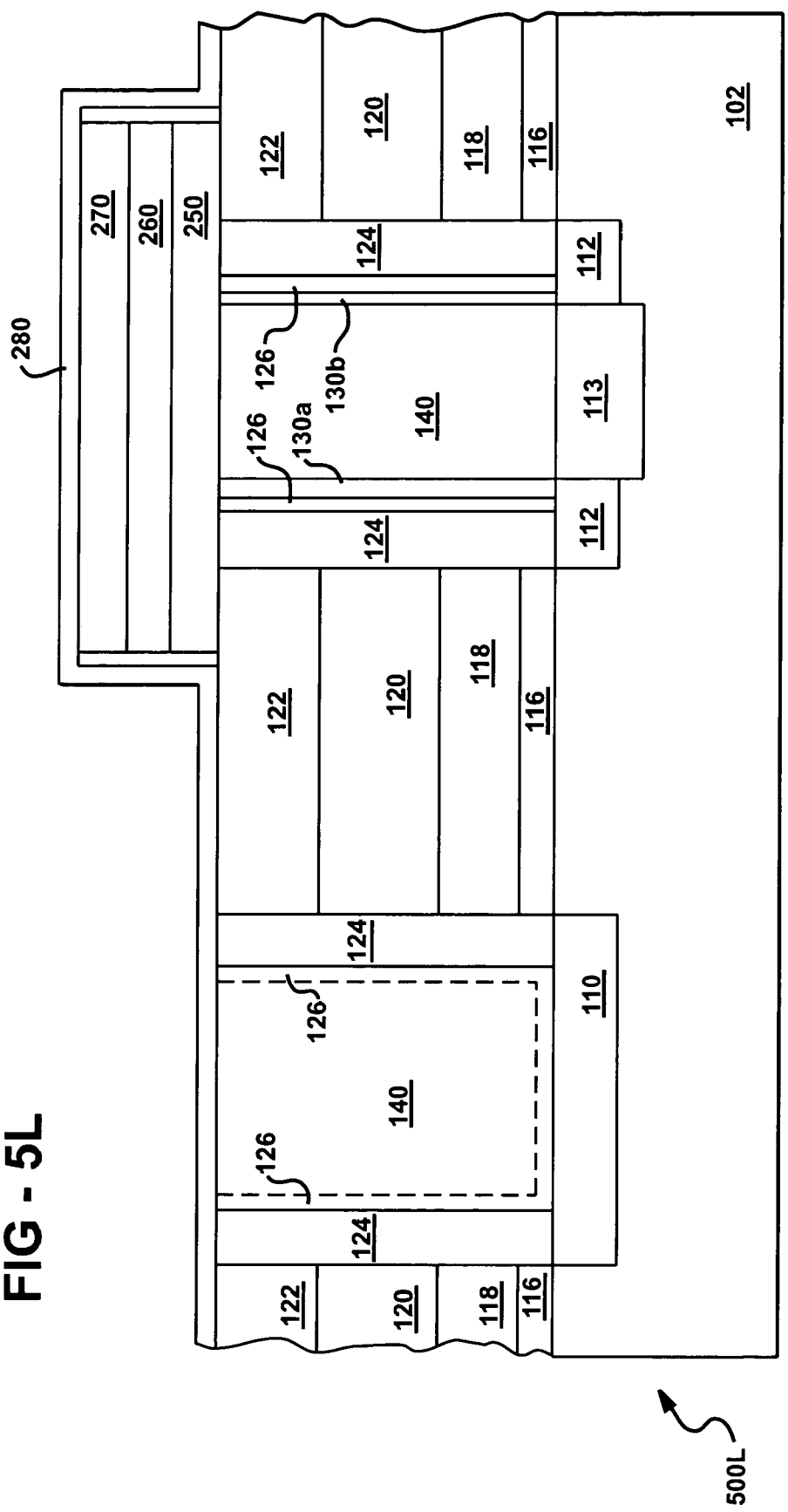
Figure 5M:
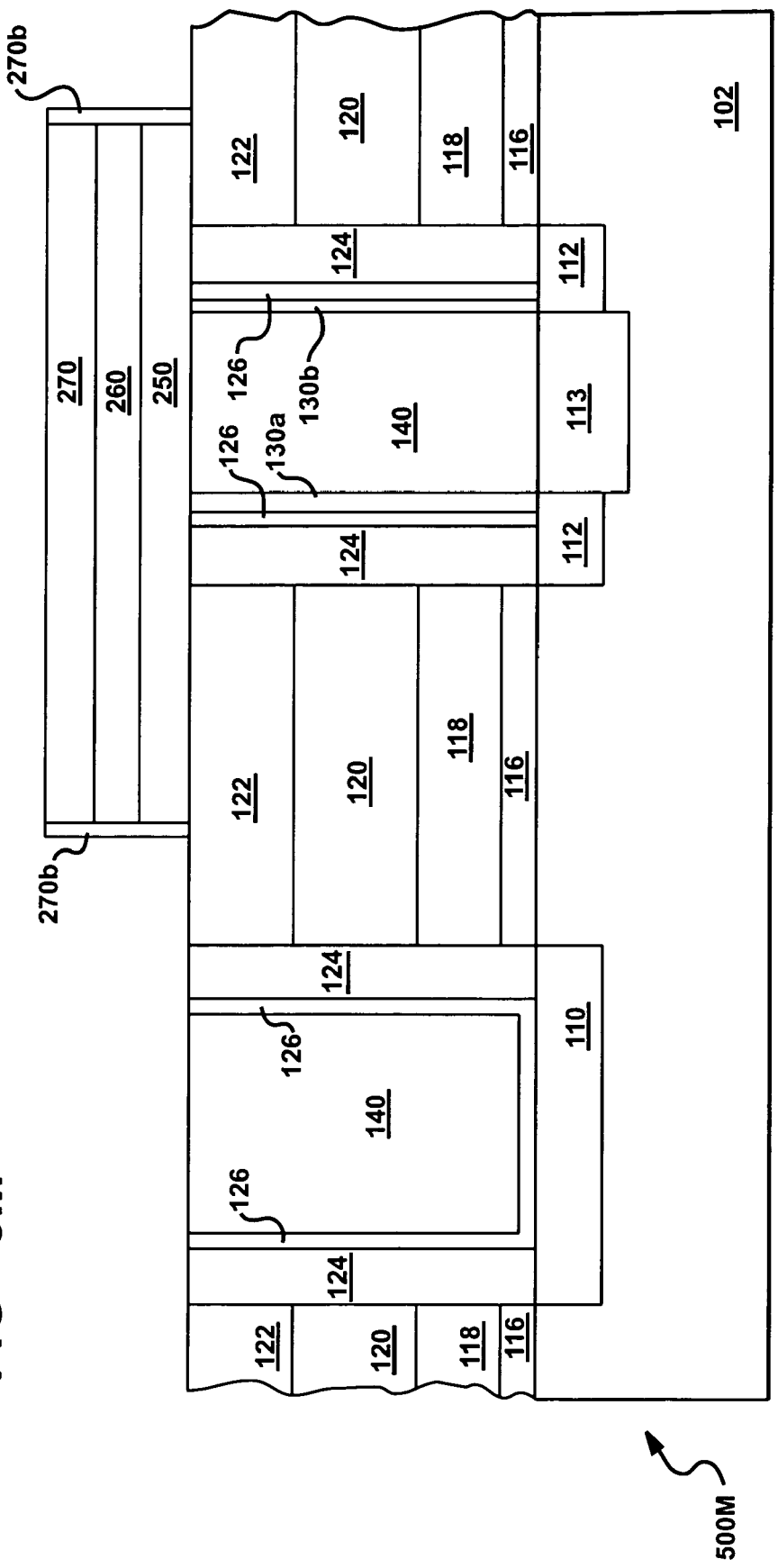
Figure 5N:
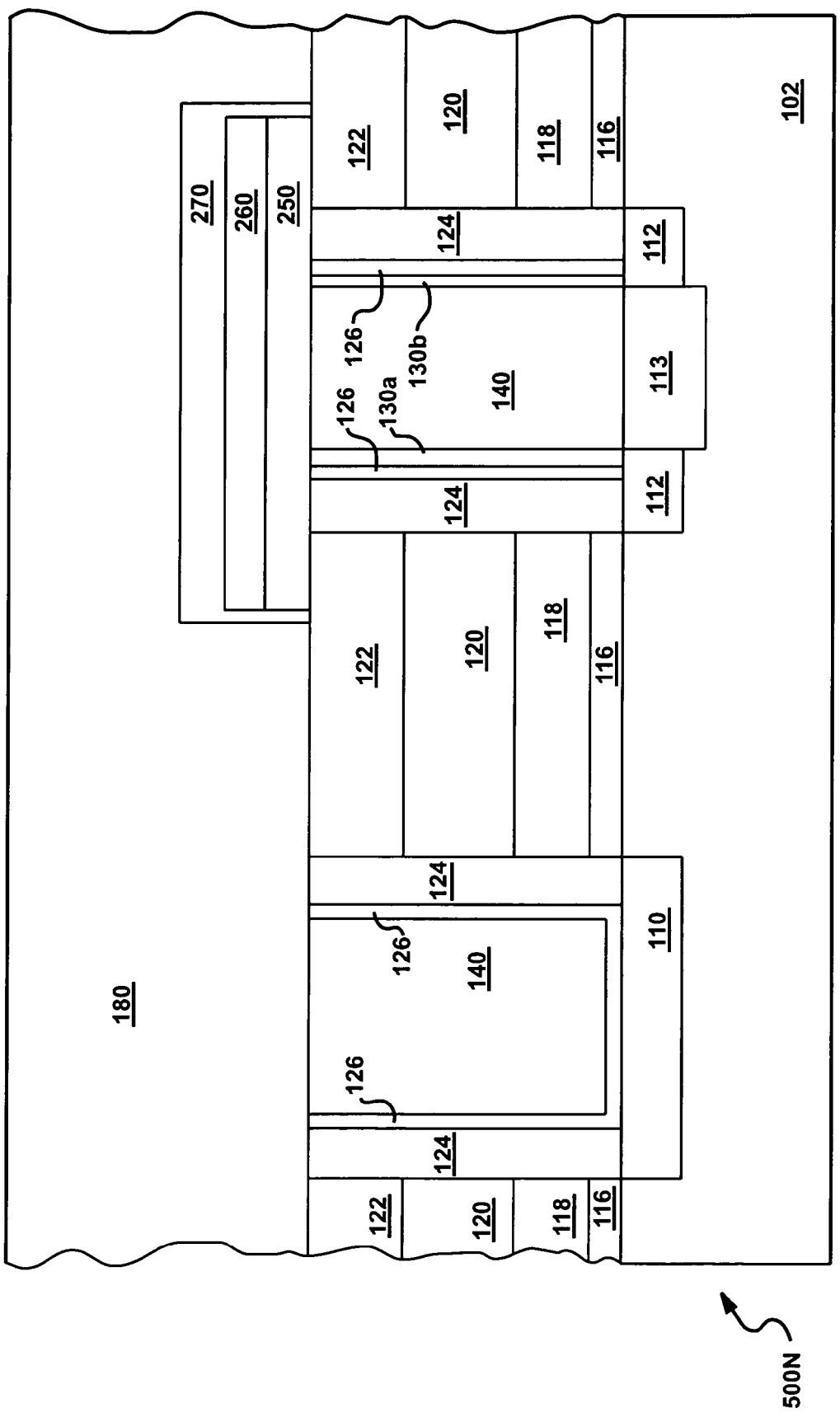
Figure 5O:
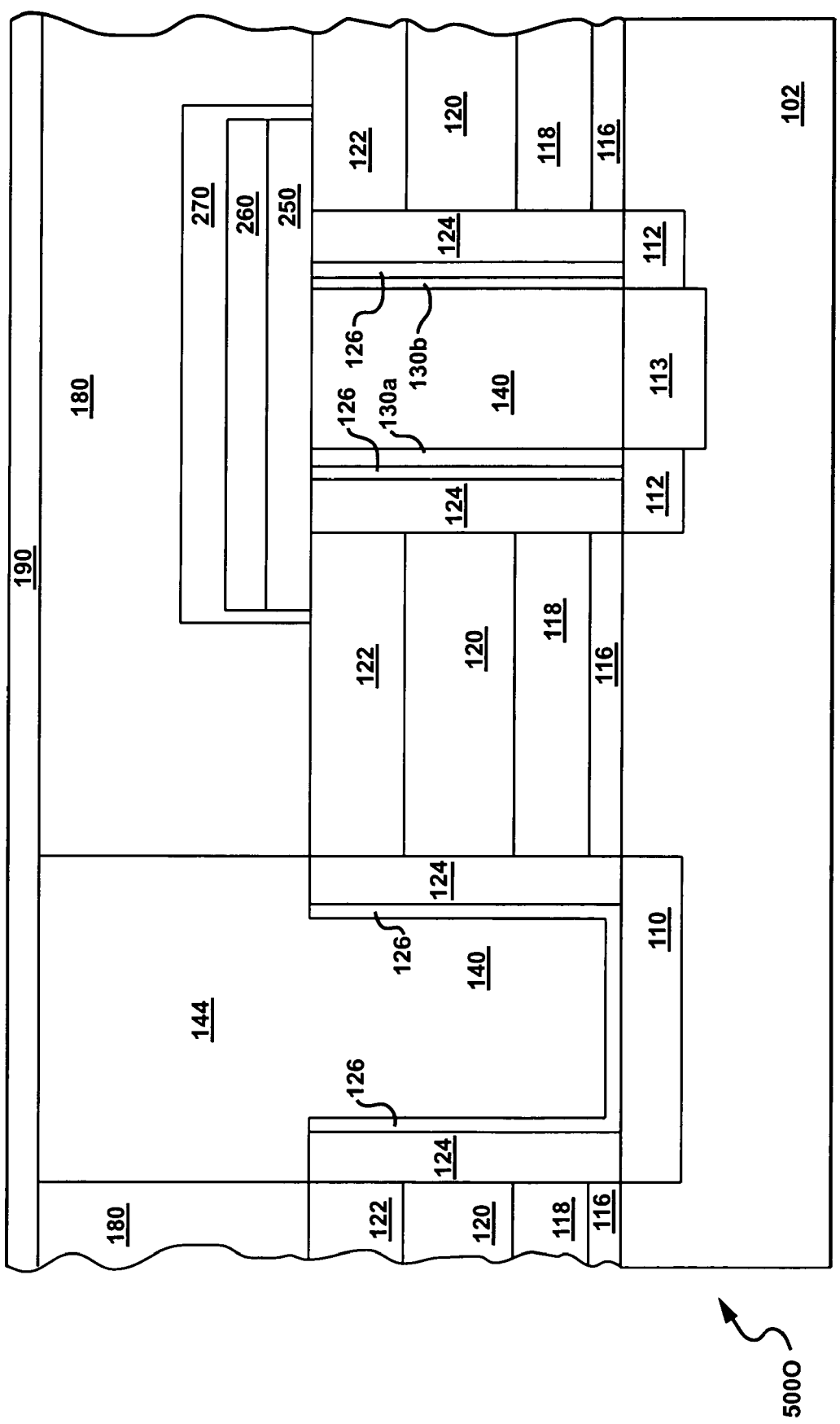

An embodiment of a method for fabricating the memory array structure 200 from FIG. 2 is shown in FIGS. 5A–5O. Referring first to FIG. 5A, an NMOS transistor array 500A is provided. FIG. 5A shows a cross-sectional view of a portion of an NMOS transistor array comprising n-doped regions 110 and 112 formed in a p-doped substrate 102. The transistor array includes gate stacks 104 which include dielectric region 116, gate region 118, metal region 120 and dielectric region 122. Dielectric regions 124 are formed as insulative sidewall spacers on the sidewall surfaces of the gate stacks 104. Dielectric regions 124 are preferably formed from a dielectric material such as TEOS oxide, silicon dioxide, or silicon nitride. The thickness of the dielectric regions 124 is preferably between about 400 angstroms and 1000 angstroms, more preferably between about about 600 and 800 angstroms, and most preferably about 700 angstroms. The spaces between the dielectric regions 124 form trenches 170, 172 extending perpendicular to the plane of the illustration. A layer of titanium silicide (not shown) may be formed above the n-doped regions 110, 112.

A dielectric layer 126 is conformally deposited onto the NMOS transistor structure 500A to form the resulting structure 500B that is shown in FIG. 5B. The thickness of the dielectric layer 126 is preferably between 100 and 500 angstroms, more preferably between about 150 and about 350 angstoms, and most preferably about 300 angstroms. The dielectric layer 126 is preferably formed from a material such as TEOS oxide, silicon dioxide, or silicon nitride.

Next, the structure 500B is appropriately masked (i.e., deposition and patterning of photoresist) and anisotropically etched to remove the dielectric layer 126 from the horizontally disposed bottom surface 173 of trench 172. Specifically, the mask is patterned so that the anisotropic etch removes the dielectric layer 126 from the bottom surface 173 of trench 172 but does not remove the dielectric layer 171 from the bottom surface of trench 170. A cross-sectional view of the mask and the result of the anisotropic etch is shown as structure 500C in FIG. 5C.

Next, the first contacts 130A,B of FIG. 5 are formed. The first contacts 130A,B are formed as conductive sidewall spacers along the sidewall surfaces 126S of dielectric layers 126 within trench 172. A contact layer 133 is conformally deposited onto structure 500C. The resulting structure 500D is shown in FIG. 5D. The layer 133 is desposited on the sidewall surfaces 126S and bottom surfaces both trenches 170 and 172 (of course, the bottom surface of trench 170 is already covered by a dielectric layer 126). The conformal deposition may be done using chemical vapor deposition (CVD) techniques. Other possible deposition methods may be used as long as the sidewall surfaces are covered by the contact layer 133.

The structure 500D is anisotropically etched to form the contuctive sidewall spacers 130A,B shown in FIG. 5E (structure 500E). The anisotropic etch removes the contact layer 133 from the horizontally disposed surfaces. The contact layers 133 remaining on the sidewall surfaces 126S of trench 172 are referred to herein as "sidewall layers".

These sidewall layers form the conductive sidewall spacers 130A,B. Conductive sidewall spacers 130A,B are the first electrical contacts for the memory device 100. The contact layer 133 remaining on the sidewall surfaces 126S within trench 170 will be removed by a later step in the fabrication process.

Assuming that the contact layer 133 conformally coats the surfaces onto which it is deposited, the conductive sidewall spacers 130A,B will have a lateral thickness substantially equal to the selected thickness of the contact layer 133. Preferably, the contact layer 133 is deposited so that the resulting conductive sidewall contacts 130A,B have substantially uniform thickness between about 50 and about 1000 Angstroms, and more preferably between about 100 and about 500 Angstroms.

The contact layer 133 and the resulting conductive sidewall contacts 130A,B may be formed from any electrically conductive material. Examples of materials include titanium nitride, titanium aluminum nitride, titantium carbonitride, titanium silicon nitride. Other examples of materials include molydenum, carbon, tungsten, and titanium-tungsten.

It is noted that the anisotropic etch which removes the contact layer 133 from the bottom surface of trench 172 also removes the titanium silicide layer from the bottom of the same trench 172 thereby electrically isolating conductive sidewall spacer 130A from conductive sidewall spacer 130B. However, the titanium silicide at the bottom surface of trench 170 is not removed because it is protected from the anisotropic etch by the dielectric layer 126.

Next, channel stop region 113 is formed in the n-doped drain region 112 creating two neighboring, electrically isolated drain regions 112. Generally, the channel stop region 113 has a conductivity type opposite that of the source and drain regions 110, 112. In the NMOS environment shown, the channel stop region 113 comprises p-doped silicon. The channel stop region 113 may be formed by the implantation of boron ions using well known ion implantation techniques. The resulting structure 500F is shown in FIG. 5F.

Next, the structure 500F is appropriately masked (via photoresist deposition and patterning) and isotropically etched to remove the remaining contact layer 133 from the sidewalls surfaces 126s in trench 170. The conductive sidewall spacers 130A,B in trench 172 are protected from the isotropic etch by the photoresist mask. The etch is selected so that it does not remove the dielectric layer 126 from trench 170. A cross-sectional view of the mask and the resulting structure after the isotropic etch is shown as structure 500G in FIG. 5G.

It is noted that the same mask and etch are used to define the width and positioning of the conductive sidewall spacers 130A,B along the width of the memory array (i.e., parallel to channel width and perpendicular to the plane of the illustration of FIG. 5G). FIG. 3 is a cross-section view of the memory array through a conductive sidewall spacer (130A or 130B) and parallel to the width of the memory array. FIG. 3 shows how the mask and etch may be used to create a plurality of conductive sidewall spacers, having width W, spaced along the width of the memory array.

Next, a dielectric layer is deposited onto the structure 500G. The resulting structure 500H is shown in FIG. 5H. The thickness of the layer 140 is selected to fill trench 170 and trench 172. The thickness of the layer 140 is preferably between about 500 and about 5000 angstroms, and it is more preferably between about 1000 and about 3000 angstroms. Examples of materials which may be used for the dielectric layer 140 include TEOS oxide, silicon dioxide and silicon nitride.

After the dielectric layer 140 is deposited, the structure 500H is chemically mechanically polished (CMP). The CMP process continues at least until the conductive sidewall spacers 130A,B are exposed. The resulting structure, after the CMP is complete, is shown as structure 500I in FIG. 5I.

Next, a layer of phase change memory material 250 is deposited onto structure 500I. A layer of insulation material 260 is deposited on top of the phase change memory material 250, and a layer of a conductive material 270 is deposited on top of the insulation material 260. The resulting structure 500J is shown in FIG. 5J.

The structure 500j is masked and layers 250, 260, 270 are anisotropically etched to form structure 500k shown in FIG. 5K. Layers 250, 260, 270 are anisotropically etched away from the top of the trench 170.

Next, a layer 280 of conductive material is conformally deposited on top of structure 500K to form structure 500L in FIG. 2L. The conductive layer 280 is anisotropically etched so that only the sidewall layers 270B deposited along the sidewall surfaces of layers 250, 260, 270 remain. The resulting structure 500M is shown in FIG. 5M. Conductive layers 270A and 270B collectively form a second contact 290 for the memory device. In the embodiment shown, only a portion of the side layers 280 of the second contact 290 are adjacent to the memory layer 250.

The conductive layers 270A and 270B may all be formed of the same conductive material or they may be formed from different conductive materials. Examples of the materials which may be used for conductive layers 270A and/or 270B include titanium nitride, titanium aluminum nitride, titanium carbonitride, titanium silicon nitride. Other examples of materials include molydenum, carbon, tungsten, and titanium-tungsten.

The remaining processing steps in the formation of the memory structure 200 shown in FIG. 2 are well known in the art. An upper dielectric layer 180 is formed over the semi-conductor device structure 500M to form structure 500N shown in FIG. 5N. Preferably, the upper dielectric layer 180 comprises borophosphosilicate glass (BPSG). The thickness of the upper dielectric layer 180 may be between 6,000 and 10,000 angstroms. More preferably the thickness of layer 300 is between 7,000 and 9,000 angstroms, and most preferably about 8,000 angstroms.

Next, the upper dielectric layer 180 is appropriately masked and a selective anisotropic contact etch may be used to form the opening in trench 170 for a conductive plug. The selective etch will etch different dielectric materials at different rates. As a result of the selective etch, gate stacks 104 and dielectric regions 124 are protected during the etch, but the dielectric material 140 is etched away until the silicon substrate 102 (or the titanium silicide layer above the n-doped silicon) is reached.

Following the selective contact etch, the opening in trench 170 can be filled with a conductive material, such as tungsten. Tungsten plugs 144 may be formed by a blanket tungsten deposition and etch-back. The conductive lines 190 can then be patterned over the tungsten plugs 144.

The method of fabrication detailed above describes a way of making a memory array structure using only three masking steps beyond conventional CMOS logic.

The minimal unit cell area of the memory array structure of the present invention (an embodiment of which is shown in both FIGS. 2 and 3) preferably has a cell area which is less then $8F^2$ and more preferably less than $6F^2$. The method for fabricating the memory array disclosed preferably requires three or less masking steps masking steps beyond conventional CMOS processing.

Hence, disclosed herein is a method for fabricating an electrically operated memory array having a cell area less than $8F^2$, the method comprising three or less masking steps in addition to the number of masking steps used for a CMOS process flow. Also disclosed is a method for fabricating an electrically operated memory array having a cell area less than $6F^2$, the method comprising three or less masking steps in addition to the number of masking steps used for a CMOS process flow.

The phase change memory element of the present invention is a non-charge-measurement memory device so that the fabrication method described above discloses a method for fabricating a non-change-measurement, electrically operated memory array comprising three or less masking steps in addition to the number of masking steps used for a CMOS process flow.

It is further noted that the phase change memory element of the present invention is also non-charge-storage memory device so that the fabrication method described above discloses a method for fabricating a non-charge-storage, electrically operated memory array comprising three or less masking steps in addition to the number of masking steps used for a CMOS process flow.

The following table is a comparison of the phase-change memory array of the present invention compared to DRAM, SRAM, FLASH memory, and Ferroelectric memory with respective to (1) cell area, and (2) the number masking steps needed in addition to the number of masking steps used for a CMOS process flow.

TABLE

|  | (1) Cell Area | (2) Masking Steps |
| --- | --- | --- |
| DRAM | $8 F^2$ | 6–9 |
| SRAM |  |  |
| 4T | $40 F^2$ | 5 |
| 6T | $80 F^2$ | 0 |
| FLASH | $8 F^2$ | 5 |
| FERROELECTRIC | $8 F^2$ | 3 |
| PRESENT INVENTION | $6 F^2$ | 2–4 |

In an alternate embodiment of the present invention, the conductive sidewall spacers 130A,B may be modified by narrowing their width (i.e. their dimension parallel to the channel width) adjacent to the memory material.

Figure 6:
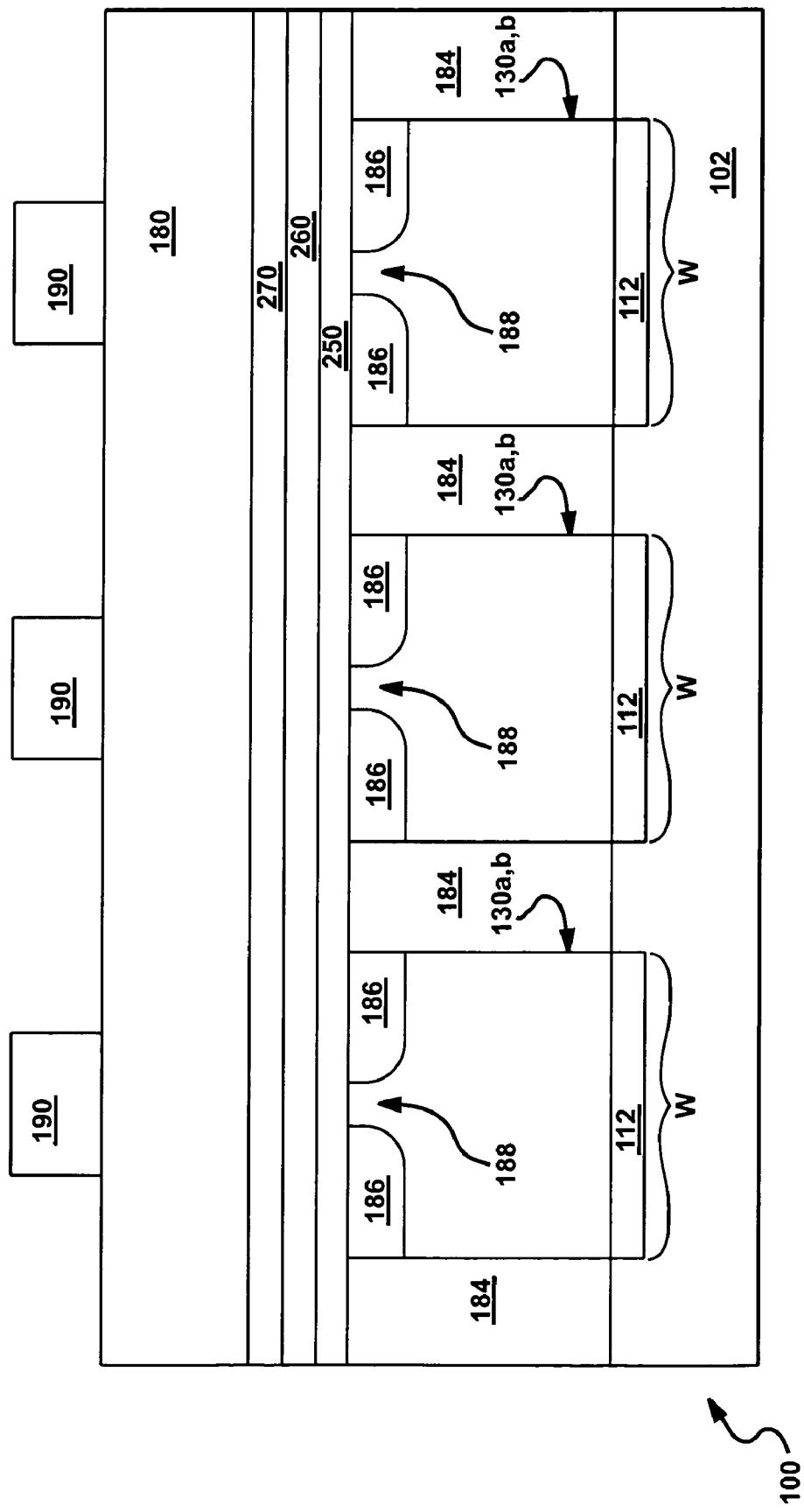
FIG. 6 is a cross-sectional view, through the width of the memory array, of a memory array of the present invention comprising narrowed conductive sidewall spacers.

An example of "narrowed" sidewall spacers is shown in FIG. 6 which shows a cross-sectional view of the conductive sidewall spacer 130A,B parallel to the channel width. In the example shown in FIG. 6, the top surfaces of the conductive spacers 130A,B have been appropriately etched to form narrowed, protruding columns 188 adjacent to the memory material (the columns protrude toward the memory layer 250). The height of the columns as well as the extent of tapering may be controlled so as to adjust both the width as well as the cross-sectional area of the conductive sidewall spacer adjacent to the memory material. The width and cross-sectional area can be made to be the smallest adjacent to the memory material.

The narrowed conductive sidewall spacers 130A,B of FIG. 6 may be made by forming oxide spacers over the conductive spacers 130A,B of FIG. 3 at those positions where a narrowed width is desired. The oxide spacers may be used as masks for anisotropic or isotropic etches which will etch the exposed sections of the conductive spacer but leave those sections of the conductive spacer underlying the mask.

Decreasing the width of the conductive spacer adjacent to the memory material decreases its cross sectional area in that region. In general, the smaller the area of a cross-section, the higher the current density within that cross-section. The increase current density causes increased Joule heating adjacent the memory material. This provides for increased heat flow into the memory material.

The shape of the conductive sidewall spacers as well as their orientation with respect to the memory material also decreases the amount of heat energy transferred back into the conductive spacer from the memory material back.

In the memory element shown in FIG. 1, each of the first contacts 130A,B is a conductive sidewall spacer formed from a single layer of conductive material. As described, the conductive spacer may be formed by the conformal deposition of a single contact layer onto a sidewall surface followed by an anisotropic etch of the contact layer.

Alternately, the conductive sidewall spacers may be formed as a multi-layered conductive spacer from more than one contact layer. Generally, the conductive sidewall spacers of the present invention may be formed from one or more, two or more, three or more contact layers.

Figure 7:
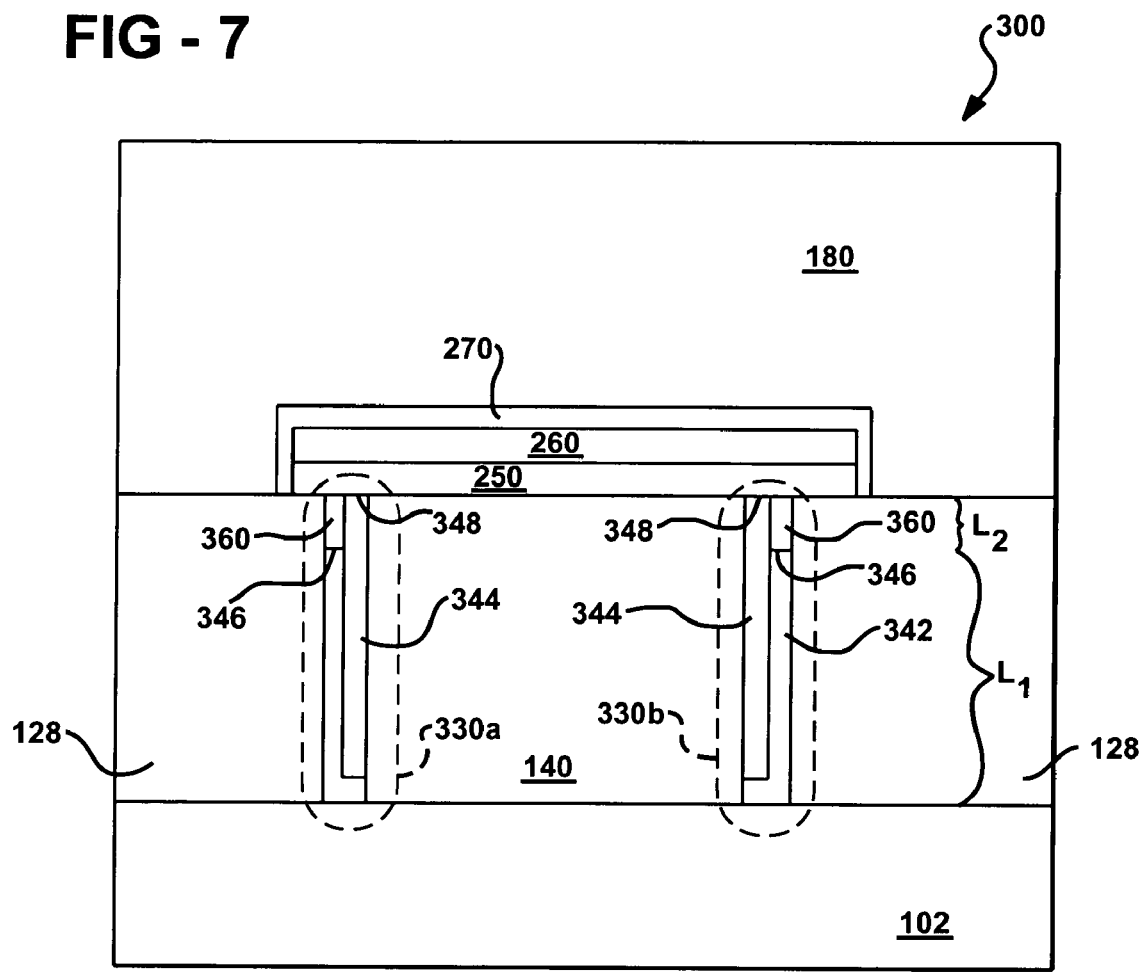
FIG. 7 is a cross-sectional view of a memory device of the present invention comprising dual-layered conductive sidewall spacers.

The memory device 300 shown in FIG. 7 is an alternate embodiment of the memory device of the present invention wherein each of the first contacts 130a,b is a conductive sidewall spacer formed from two contact layers. Like the memory device 100 shown in FIG. 1, the memory device 300 comprises two memory elements.

Figure 8A:
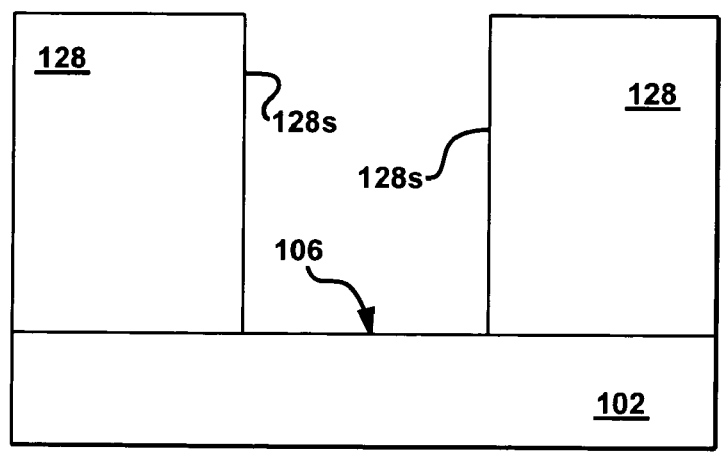
FIGS. 8A through 8E show schematic cross-sectional views for the sequence of process steps for fabricating a memory device comprising dual-layered conductive sidewall spacers.
Figure 8B:
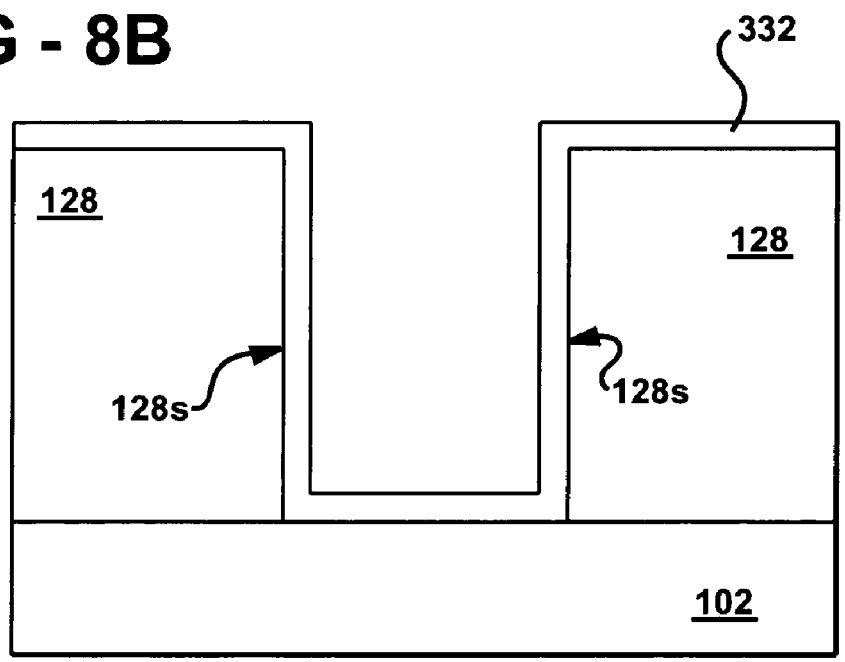
Figure 8C:
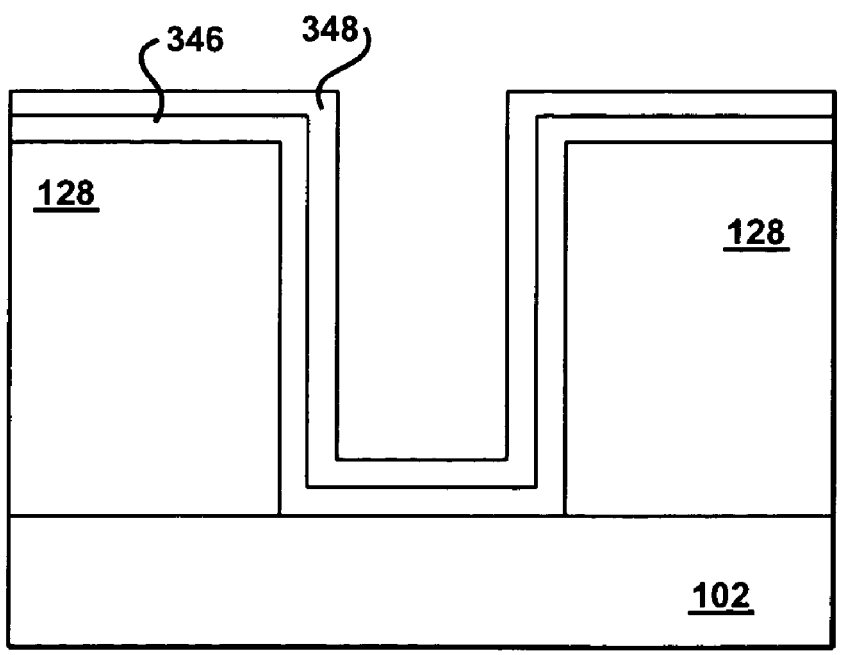
Figure 8D:
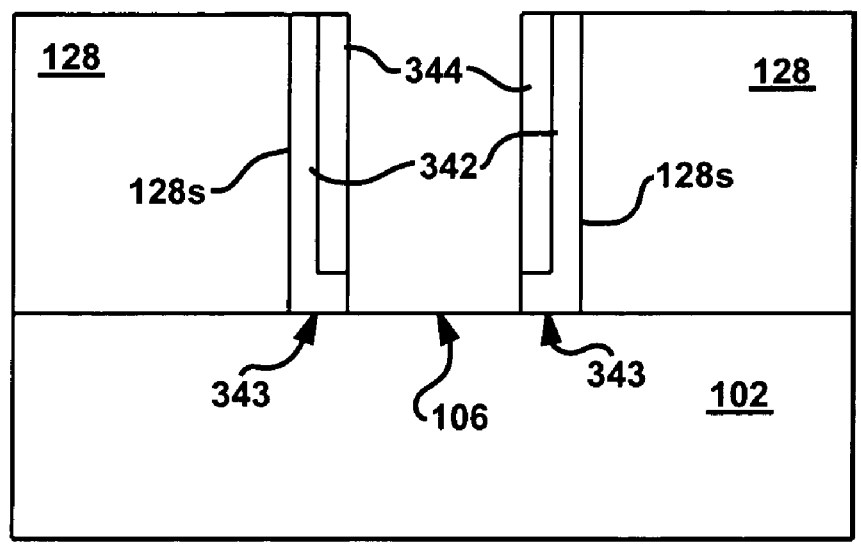
Figure 8E:
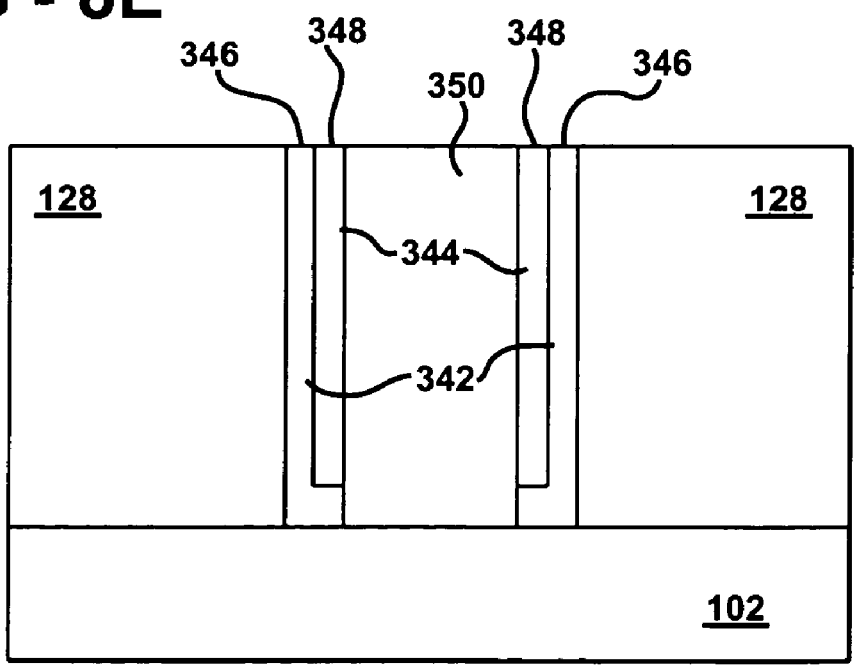

FIGS. 8A–8G shows how the memory device 300 may be fabricated. Referring to FIG. 8A, provided is a substrate 102 and dielectric layer 128 forming a trench 172 with sidewall surfaces 128S and bottom surface 106. The trench 172 extends perpendicular to the plane of the illustration. A first contact layer 332 is conformally deposited onto the top surface of layer 128 and into the trench 172, covering trench sidewall surfaces 128S and trench bottom surface 106. A second contact layer 334 is then conformally deposited onto the first contact layer 332. Next, both the first and second contact layers 332, 334 are anisotropically etched to remove the horizontally disposed portions of these layers. The remaining portions of the first contact layer 332, after the anisotropic etch, are referred to as the first sidewall layers 342. The remaining portions of the second contact layer 334 are referred to as the second sidewall layers 344. Collectively, the first sidewall layer 342 and the second sidewall layer 344 form a dual-layered conductive sidewall spacer. It is noted that the first sidewall layer, while substantially formed on the sidewall surface 128S has a small "foot" region 343 formed on the bottom surface 106.

It is noted that the lateral thickness of the first sidewall layer 342 is substantially equal to the selected thickness of the first contact layer 342. The thickness of the first contact layer 332 is selected so that first sidewall layer 342 may have a substantially uniform thickness between about 50 and about 1000 Angstroms, and preferably it will have a substantially uniform thickness between about 100 and about 500 Angstroms. Similarly, the lateral thickness of the second sidewall layer 344 is substantially equal to the selected thickness of the second contact layer 334. The thickness of the second contact layer 334 is selected so that the second sidewall layer 344 may have a substantially uniform thickness between about 50 and about 1000 Angstroms, and preferably it will have a substantially uniform thickness between about 100 and about 500 Angstroms.

A dielectric layer 350 is deposited onto the structure, filling the trench 172. The top of the structure is then chemically mechanically polished (CMP) so as to planarize the top surface and expose the top edges 346, 348 of the first and second sidewall layers 342 and 344, respectively. It is noted that in the embodiment shown, the edges 346, 348 are cross-sections of the thicknesses of the first and second sidewall layers. Specificaly, the edges 346, 348 are lateral cross-sections of the first and second sidewall layers 342, 344, respectively.

Next, the first sidewall layers 342 are selectively etched so that the top edges 346 are etched below the top edges 348 of the adjacent second sidewall layer creating indentations in the first sidewall layers 342. A dielectric layer 360 may then be deposited over the structure so as to fill these indentations. The dielectric layer 360, may be formed of TEOS oxide, silicon dioxide, or silicon nitride. Next, the structure is again chemically mechanically polished to planarize the top surface and ensure that the top edges 348 of the second sidewall layer 344 is exposed. Memory layer 250, insulation layer 260, and conductive layer 270 are deposited as described above to form the structure shown in FIG. 7.

Referring to FIG. 7, it is seen that the top edge 348 of the second sidewall layer 344 is adjacent to the memory material and makes contact with the memory material. In contrast, the top edge 346 of the first sidewall layer 342 is remote to the memory material and does not make contact with the memory material. In fact, the top edge 346 of the first contact layer 342 is physically separated from the memory material by the dielectric material 360.

Hence, the area of contact between the dual-layered conductive sidewall spacers 330A,B and the memory material 250 is the area of contact between the top edge 348 of the second sidewall layer 344 and the memory material 250. The first sidewall layers 342 are not contiguous with the memory material 250 and are only indirectly electrically coupled to the memory material 250 through the second sidewall layers 344.

The materials for the first and second sidewall layers 342, 344 are preferably selected so that the electrical resistivity of the first sidewall layer 342 is less than the electrical resistivity of the second sidewall layer 344.

Examples of material which may be used for the first sidewall layer 342 include titanium tungsten, tungsten silicide, tungsten, molydenum, and N+ doped polysilicon, and titanium nitride. The first sidewall layer 342 may have a thickness between about 50 angstoms and 300 angstroms, and preferably between about 100 angstroms and 200 angstroms.

The second sidewall layer 344 preferably has a resisitivity which is greater than the resistivity of the first sidewall layer. Examples of materials which may be used for the second sidewall layer include titanium nitride, titanium carbonitride, titanium aluminum nitride, titanium siliconitride, carbon, N− doped polysilicon, and forms of titanium nitride. The second sidewall layer 132 may have a thickness between about 50 angstroms and 300 angstroms, and preferably between about 100 angstroms and 200 angstroms.

Referring to FIG. 7, it is seen that the dual-layered conductive sidewall spacers 330A,B may be thought of as having a first segment L1 extending from substrate 102 to edge 346 of first sidewall layer 342, and a second segment L2 extending from edge 346 to edge 348 of second sidewall layer 344 (adjacent to the memory material).

For segment L1, first sidewall layer 342 electrically shunts (provides a parallel or alternative electrical path for) the second sidewall layer 344. The first and second sidewall layers are electrically in parallel so current can pass through either layer. Since the resistivity of the first sidewall layer is less than the resistivity of the second sidewall layer, most of the electrical current will pass through the first sidewall layer. Segment L1 thus provides a low resistance current path.

For segment L2, all of the electrical current must pass through the more resistive second sidewall layer. Segment L2 thus provides a high resistance current path. (It is noted that the resistivity of segment L2 is higher than that of L1 when the resistivities of the two sidewall layers are not the same.)

Since the resistance of the segment L2 is greater than that of L1 most of the Joule heating within the dual layered conductive sidewall spacer will occur in section L2 adjacent to the memory material. This provides for more efficient heating of the memory material.

In the embodiments of the memory device described above, the first electrical contacts of each of the memory elements are conductive sidewall spacers formed by depositing one or more contact layers onto the sidewall surfaces of a trench.

Alternately, the conductive sidewall spacers may be formed by conformally depositing one or more contact layers onto the sidewall surface or surfaces of a via hole. The via hole may be round, square, rectangular or irregularly shaped. The conductive sidewall spacers may also be formed by conformally depositing one or more contact layers onto the sidewall surfaces of a pillar or mesa.

Figure 9:
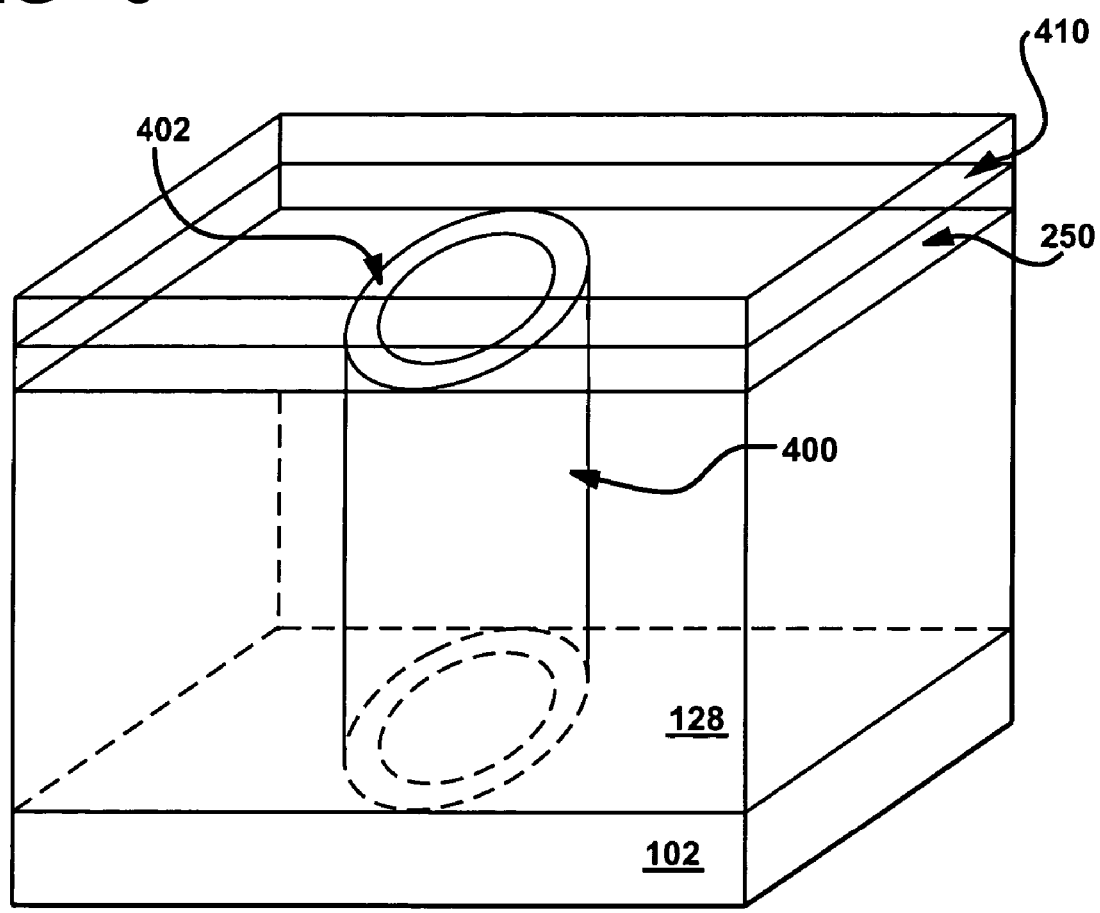
FIG. 9 is a three-dimensional view of a memory element of the present invention comprising a conductive sidewall spacer formed in a via.

FIG. 9 shows a three-dimensional view of a memory structure comprising a first contact 400, a layer of memory material 250, and a second contact 410. The first contact 400 is a conductive sidewall spacer formed by conformally depositing a contact layer into a round via and then anisotropically etching the contact layer to remove the horizontally disposed surfaces. The remaining portion on the sidewall surface of the via is the tubular shaped conductive sidewall spacer 400.

The remaining space in the via is filled with a dielectric material and the structure is then chemically mechanically polished to expose the conductive sidewall spacer. A layer of memory material is deposited onto the top of the structure so that the bottom surface of the memory material makes contact with the annular top edge of the conductive sidewall spacer. A layer of conductive material is deposited on top of the memory material to form a second contact.

The conductive sidewall spacer 400 has a annular top edge 402 The thickness of the conductive sidewall spacer 400, and the thickness of the annular top edge 402, is substantially equal to the thickness of the conformally deposited contact layer. In the embodiment shown in FIG. 9 it is noted the edge 402 is a lateral cross-section of the conductive spacer 400.

The area of contact between the conductive spacer 400 and the memory material 250 is the area of contact between the memory layer 250 and the annular edge 402. If the entire edge 402 makes contact with the memory layer, then the area of contact is an annular ring. The area of contact is proportional to the thickness of the edge which is substantially equal to the thickness of the deposited contact layer. Hence, the area of contact can thus be reduced by controlling the deposition process of the contact layer and the size of the effective electrode area of the memory device shown in FIG. 9 may be reduced beyond that permitted by the resolution of photolithography.

Figure 10A:
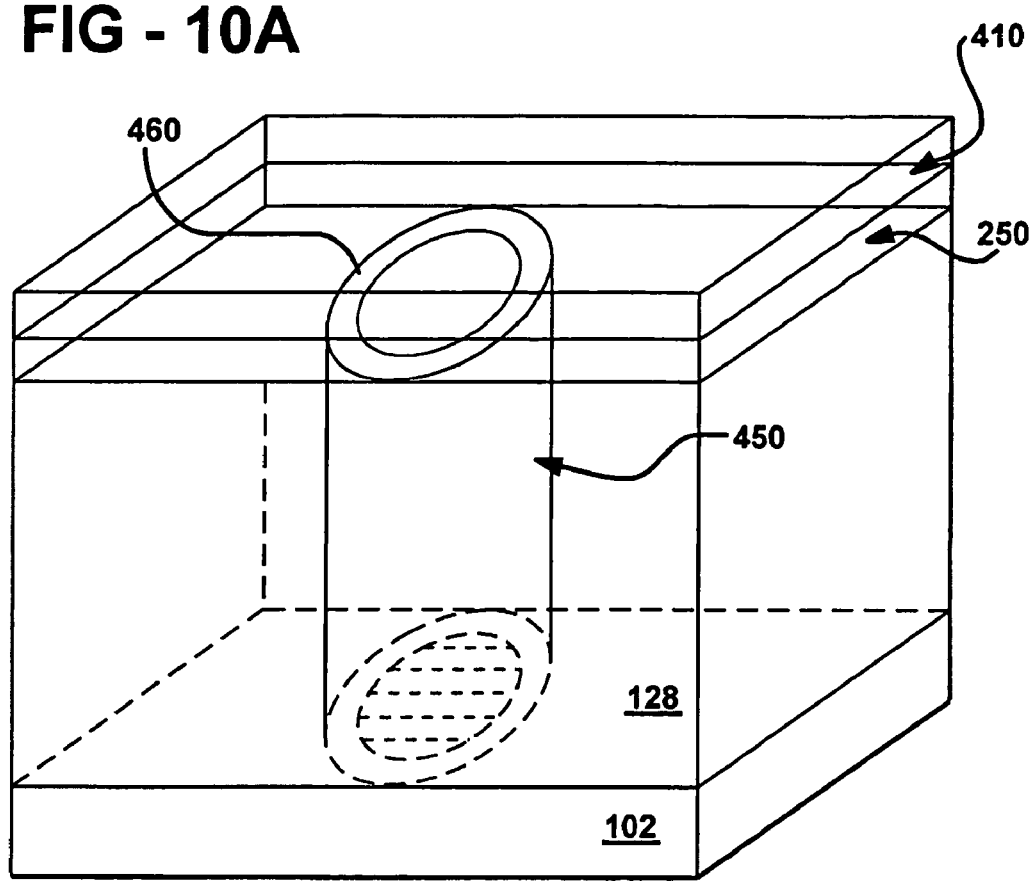
FIG. 10A is three-dimensional view of a memory element of the present invention comprising a cup-shaped surface with an open end adjacent to the memory material.
Figure 10B:
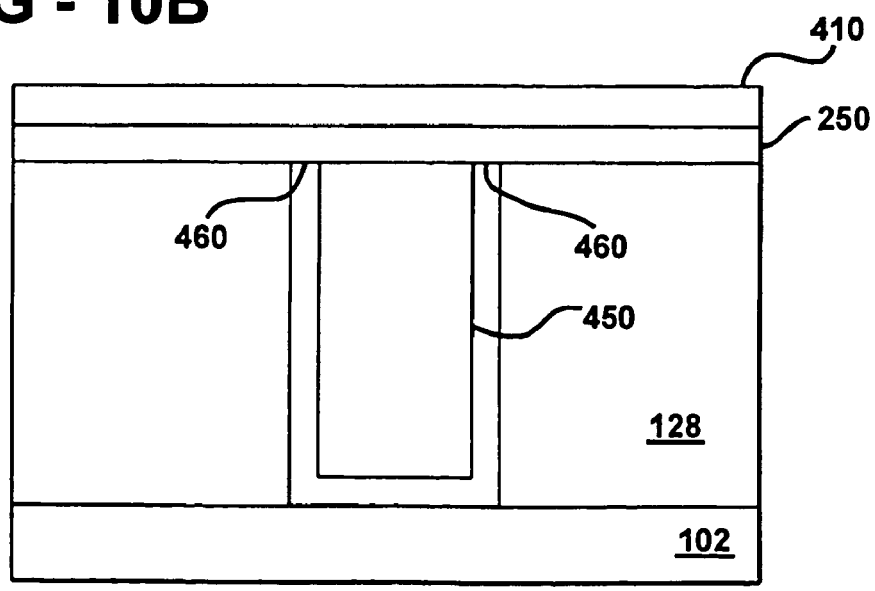
FIG. 10B is cross-sectional view of a memory element of the present invention comprising a cup-shaped surface with an open end adjacent to the memory material.

It is noted that the first contact 400 shown in FIG. 9 is formed as the conductive sidewall spacer 400 having a tubular shape with two open ends. Alternately, the contact may be formed as a cup-shaped shell 450 having the three-dimensional view shown in FIG. 10a and the cross-sectional view shown in FIG. 10b. As noted the contact 450 has edge 460 which is adjacent to the memory material. The area of contact between the contact 450 and the memory material 250 is the area of contact between the edge 460 and the memory material 250.

The cup-like shell 450 may be formed by depositing a contact layer into a via, filling the remainder of the via with a dielectric, and chemically mechanically polishing the surface to planarize the surface and expose the top edge 460 of the contact 450. The layers 250 and 410 may then be deposited. The area of contact between the contact 450 and the memory material is the region of contact between the edge 460 and the memory material. If the entire edge makes contact with the memory material then the area of contact is in the form of an annular ring.

Also disclosed herein is an electrically programmable memory element comprising a volume of phase change memory material, a first electrical contact, and second electrical contact, where the first contact comprises a contact layer having an edge adjacent to the volume of phase change memory material.

Generally, the contact layer is not restricted to any specific orientation or conformation. The contact layer may be substantially vertically disposed. The contact layer may be substantially vertically disposed, for example, by forming the first contact as a conductive sidewall spacer on a substantially vertically disposed sidewall surface.

Figure 11A:
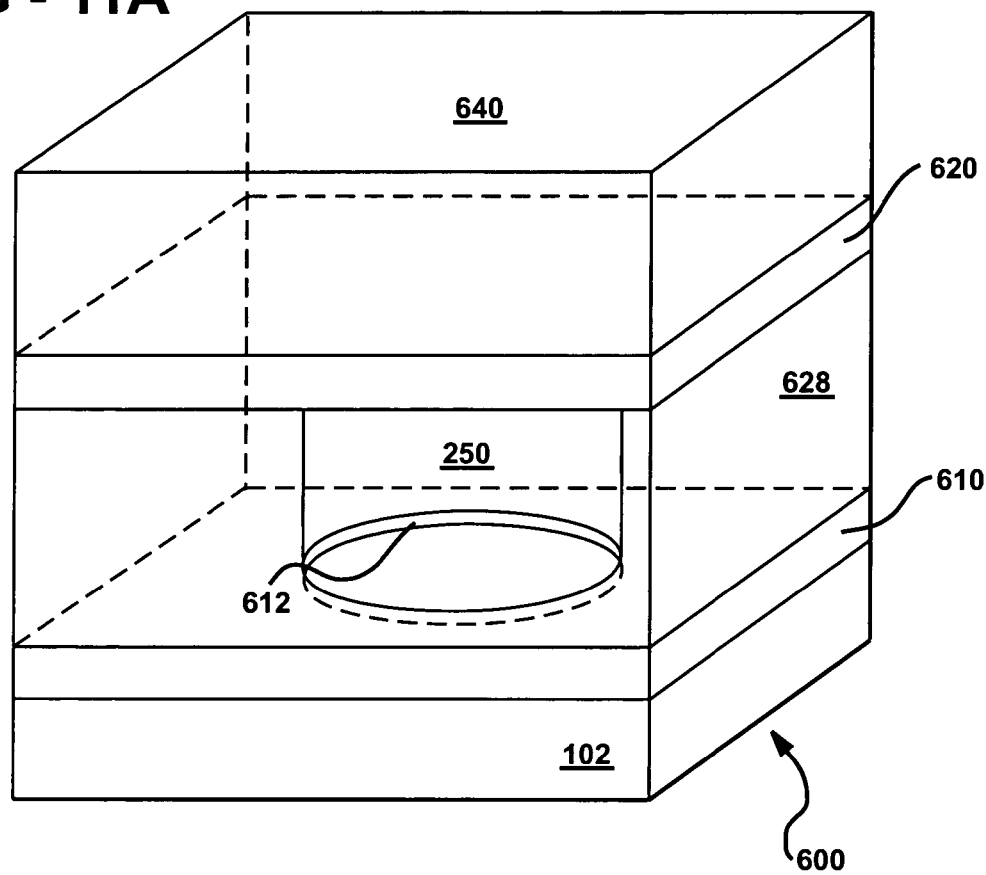
FIG. 11A is a three-dimensional view of a memory element having a contact which is a contact layer adjacent to the memory material.
Figure 11B:
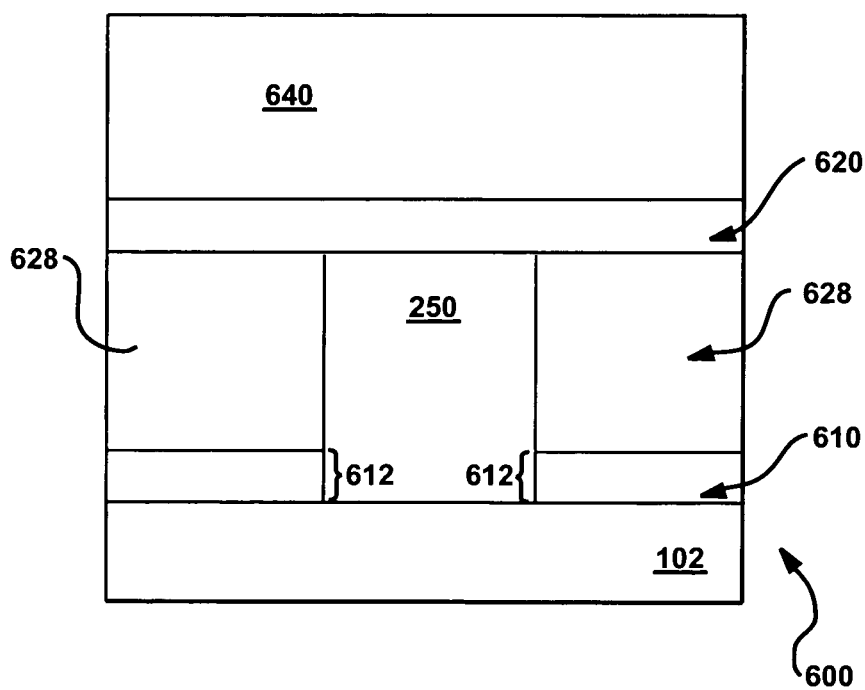
FIG. 11B is a cross-sectional view of a memory element having a contact which is a contact layer adjacent to the memory material.

Alternately, the contact layer may be substantially horizontally disposed. The contact layer may be substantially horizontally disposed by depositing the contact layer onto a substantially horizontally disposed subtrate. FIG. 11A shows a three-dimensional view of an alternate embodiment of a memory element of the present invention formed on a single crystal silicon semiconductor substrate wafer 102. The memory element 600 comprises the volume of memory material 250, a first electrical contact 610 which is electrically coupled to the memory material 250, and a second electrical contact which is electrically coupled to the memory material and which is spacedly disposed from the first contact 610. FIG. 11B is a cross-sectional view of the same memory device 600.

In the embodiment shown in FIGS. 11A,B the first contact is a contact layer 610 which is substantially horizontally disposed onto the substrate 102. The contact layer has an edge 612 which is adjacent to the volume of memory material 250. The area of contact between the memory material 250 and the contact layer 610 is the area of contact between the memory material 250 and edge 612. (As shown, in this embodiment the edge, is a cross-sectional slice parallel to the thickness). The area of contact between the contact layer 610 and the memory material 250 is proportional to the thickness of the contact layer 610. It is noted that electrical coupling between the memory material and the contact layer 610 is by way of all or a portion of the edge 612. The remainder of the volume of memory material 250 is electrically isolated from the first contact 610 by the dielectric material 628.

Preferably, the edge 612 encircles a cross-sectional slice of the volume of memory material 250. As used herein, "encircles" means that the edge 612 passes completely around a cross-sectional slice of the volume of memory material 250. However, the memory element may be structured so that the edge only partially encircles a cross-sectional slice of the volume of memory material 250. In the embodiment shown, the cross-sectional slice is substantially parallel to the plane of the substrate 102, however, other orientations are also possible.

The second contact may be as a layer of conductive material and is preferably formed as a thin-film layer. In the embodiment shown in FIGS. 11A,B, the second contact 620 is a conductive layer 620 that is deposited on top of the memory material 250 so that the bottom surface of the conductive layer 620 is adjacent to the top surface of memory material 250.

Figure 12:
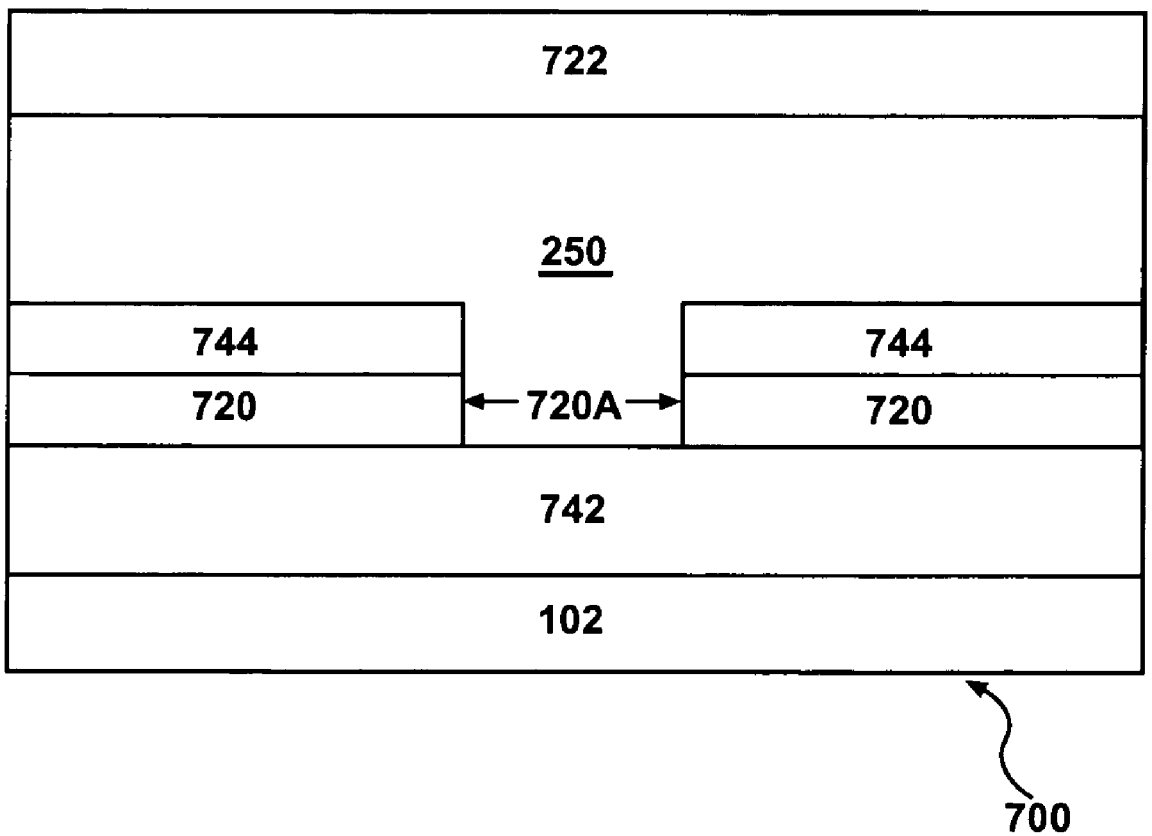
FIG. 12 is a cross-sectional view of an embodiment of a memory element of the present invention wherein one of the electrical contacts has a sidewall adjacent to the memory material.

FIG. 12 shows a cross-sectional view of an embodiment of the memory element of the present invention formed on a single crystal silicon semiconductor substrate wafer 102. The memory element 700 includes a volume of memory material 250 described herein. The memory element further includes a first electrical contact for supplying the electrical input signal to the memory material and a second electrical contact, spacedly disposed from the first electrical contact, also for supplying the electrical input signal to the memory material.

In one embodiment of the present invention, the first contact is a thin-film layer having a sidewall adjacent to at least a portion of the volume of memory material. Preferably, a sidewall of a thin-film layer is substantially perpendicular to the plane of the substrate of the memory element (i.e., the plane defined by the substrate surface). In the embodiment shown in FIG. 12, the sidewall is a side of a thin-film layer substantially perpendicular to substrate 102.

In the embodiment shown in FIG. 12, the first contact is a thin-film layer having a sidewall adjacent to at least a portion of the volume of memory material. The first contact layer 720 is positioned lateral to the volume of memory material 250, and only sidewall 720A of the first contact layer 720 is adjacent to the memory material. Preferably, sidewall 720A encircles a cross-sectional slice of the volume of memory material 250. As used herein, "encircles" means that the sidewall 720A passes completely around a cross-sectional slice of the volume of memory material. However, the memory device may be structured so that the sidewall 720A only partially encircles a cross-sectional slice of the volume of memory material 250. In the embodiment shown, the cross-sectional slice is substantially parallel to the plane of the substrate surface, however, other orientations are also possible. The thickness of the cross-sectional slice is equal to the height of the sidewall 720A which is equal to the thickness of the first contact layer 720.

The area of contact between the sidewall 720A and the memory material 250 is directly proportional to the height of the sidewall 720A (i.e., the thickness of the first contact layer 720). Specifically, the area of contact is equal to the circumference of the sidewall 720A around the cross-sectional slice of memory material 250 multiplied by the height of the sidewall.

The second contact may be a thin-film layer. In the embodiment shown in FIG. 12, the second contact is thin-film contact layer 722 that is deposited on top of the memory material 250 so that the bottom surface of the second contact layer 722 is adjacent to the top surface of memory material 250.

The term "effective electrode area", as defined herein, is the smallest area of contact between the volume of memory material and the electrical contacts. Generally, effective electrode area is related to device performance. Decreasing effective electrode area increases the current density within at least a portion of the volume of memory material. This lowers the current requirements needed for programming the device. It also decreases device programming time, and increases device speed and sensitivity.

In reference to FIG. 12, the effective electrode area is the smallest area of contact between the memory material 250, and the first and second contact layers 720, 722. This is the area defined by the area of contact between the sidewall 720A of first contact layer 720 and memory material 250. The effective electrode area may be reduced by decreasing the height of sidewall 720A. This is done by reducing the thickness of the first contact layer 720 though control of the deposition process when forming this thin-film layer. Hence, by controlling the deposition of the thin-film contact layer 720, the effective electrode area of the memory element 700 can be reduced beyond that permitted by photolithographic resolution.

To fabricate the memory element 700 shown in FIG. 12, a layer of electrical dielectric material 742 is deposited on top of substrate 102. Examples of such dielectric material include, but are not limited to, $SiO_2$, and $Si_3N_4$ First contact layer 720 is deposited on top of dielectric layer 742, and another layer of dielectric material 744 is deposited on top of the first contact layer 720. The layers 744 and 720 are etched to form a pore. Memory material 250 and the second contact layer 722 are then deposited.

The memory material may be formed from a multi-element semiconductor material, such as the chalcogenide materials disclosed herein. The memory material may be deposited by methods such as sputtering, evaporation or by chemical vapor deposition (CVD), which may be enhanced by plasma techniques such as RF glow discharge. The chalcogenide memory materials of the present invention are most preferably made by RF sputtering and evaporation. The memory material 250 is preferably deposited to a thickness of about 50 A to 5000 A, more preferably of about 75 A to 1000 A, and most preferably of about 100 A to 500 A in thickness.

Figure 13:
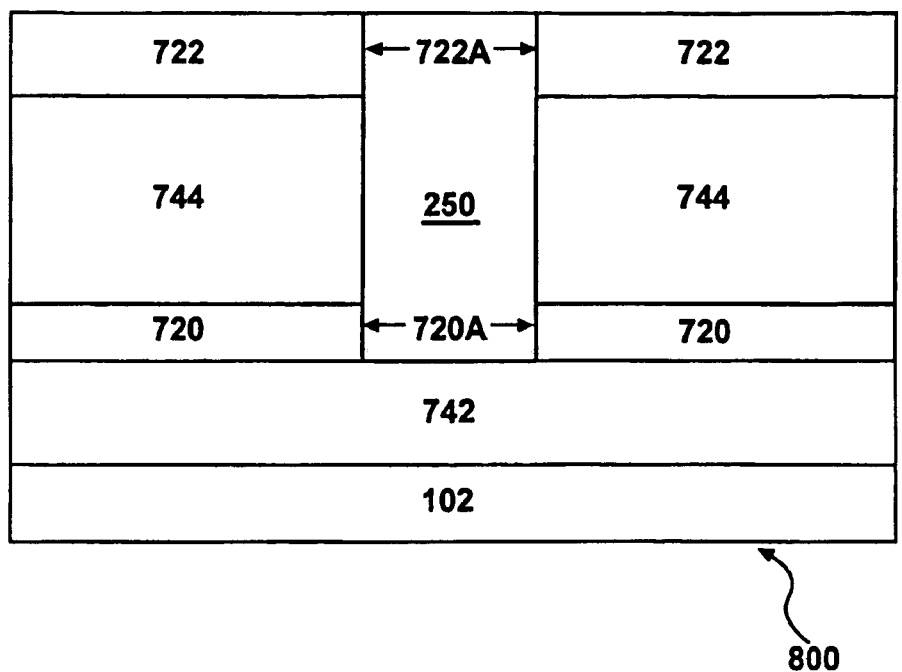
FIG. 13 is a cross-sectional view of an embodiment of a memory element of the present invention wherein both electrical contacts have sidewalls adjacent to the memory material.

Alternate embodiments for the present invention are possible. For example, the device may be structured so that a sidewall of the second contact layer 722, rather than first contact layer 720, is adjacent to at least a portion of the memory material. As well, the device may be structured so that both the first and second contacts are thin-film layers having sidewalls that are adjacent to at least a portion of the memory material. Preferably, the device may be structured so that the sidewalls of the first and second contacts each encircle respective cross-sectional slices of the volume of memory material. FIG. 13 shows a memory element 800. Memory element 800 is an embodiment of the present invention wherein sidewalls 720A, 722A of the first and second contact layers 720, 722, respectively, are both adjacent to and encircling cross-sectional slices of the memory material 250. Layers 742 and 744 are layers of dielectric material.

Preferably, the first contact is deposited to a thickness between about 50 to about 500 Å. More preferably, the first contact is deposited to a thickness of about 75 to about 250 Å. Most preferably, the first contact is deposited to a thickness of about 100 to about 200 Å. Preferably, the second contact is deposited to a thickness between about 50 to about 500 Å. More preferably, the second contact is deposited to a thickness of about 75 to about 250 Å. Most preferably, the second contact is deposited to a thickness of about 100 to about 200 Å. In the embodiment shown in FIG. 13, both the first and second contacts are deposited to a thicknesses between about 50 to about 500 Å.

Figure 14:
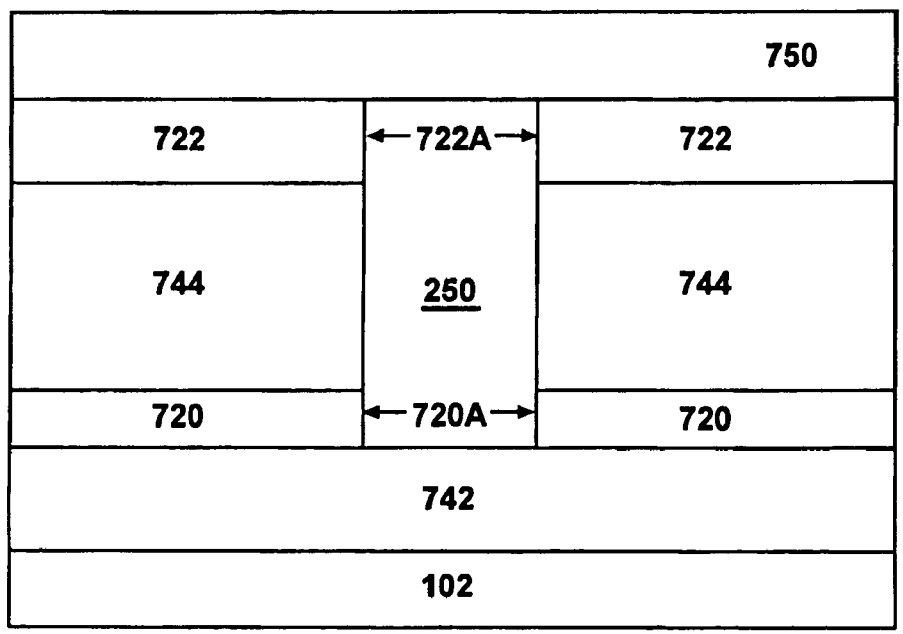
FIG. 14 is a cross-sectional view of an embodiment of a memory element of the present invention.

FIG. 14 shows a memory element 900. Memory element 900 is an embodiment of the invention having an additional dielectric layer 750 formed over the second contact 722 and over the phase-change material 250.

Generally, the first contact is formed from an electrically conductive material. Preferably, the first contact includes at least one element selected from the group consisting of Ti, V, Cr, Zr, Nb, Mo, Hf, Ta, W, B, C, N, O, Al, Si, P, S, and mixtures or alloys thereof. More preferably, the first contact includes Ti, and W. More preferably, one of the contact layers may include, in atomic percent, between about 5 to about 30% titanium and between about 70 to about 95% tungsten. Alternately, in another embodiment, at the first contact may include Ti, and N. Preferably, the first contact may include, in atomic percent, between about 5 to about 30% titanium, and between about 70 to about 95% nitrogen. Alternately, the first contact may include Pt, and Ir. Preferably, the first contact may include, in atomic percent between about 97% Pt, and about 3% Ir.

The second contact may also be formed of any conductive material. Preferably, the second contact includes at least one element selected from the group consisting of Ti, V, Cr, Zr, Nb, Mo, Hf, Ta, W, B, C, N, O, Al, Si, P, S, and mixtures or alloys thereof. More preferably, the second contact includes Ti, and W. More preferably, the second contact may include, in atomic percent, between about 5 to about 30% titanium and between about 70 to about 95% tungsten. Alternately, in another embodiment, the second contact may include Ti, and N. Preferably, the second contact may include, in atomic percent, between about 5 to about 30% titanium, and between about 70 to about 95% nitrogen. Alternately, the second contact may include Pt, and Ir. Preferably, the second contact may include, in atomic percent, between about 97% Pt, and about 3% Ir.

In the embodiment shown in FIG. 12, the first contact 720 is a thin-film layer of Ti—W, and the second contact 722 is a thin-film layer of Ti—N. Both layers may be deposited using a D-C sputtering deposition process. Both Ti—W and Ti—N have excellent ohmic contact properties and have the barrier properties necessary to prevent both the electromigration and diffusion of foreign electrode material into the memory material.

Also disclosed herein is an electrically programmable, single-cell memory element, comprising a volume of phase-change memory material; and a first and a second contact for supplying an electrical signal to the memory material where at least one of the contacts is adapted to maximize the current density adjacent to the memory material and to minimize the thermal energy flowing from the memory material to the contact.

Increasing the current density adjacent to the memory material increasing the amount of Joule heating in that region so that more heat energy can flow into the memory material. Current density (and hence Joule heating) may be increased by decreasing the cross-sectional area of the contact adjacent to the memory material.

Generally, the phase-change memory material used in the memory elements and memory arrays of the present invention may be any phase-change memory material known in the art. Specific materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

As described above, the phase change materials are preferably directly overwritable so that they can be set directly to one of a plurality of resistance values without the need to be set to a specific starting or erased resistance value, regardless of the previous resistance value of the material in response to a selected electrical input signal. Furthermore, the phase change materials preferably have a large dynamic range which provide for gray scale storage of multiple bits of binary information in a single cell by mimicking the binary encoded information in analog form and thereby storing multiple bits of binary encoded information as a single resistance value in a single cell. Furthermore, the phase change materials may have a dynamic range of electrical resistance values with the ability to be set directly to one of a plurality of resistance values within the dynamic range without the need to be set to a specific starting or erased resistance value, regardless of the previous resistance value of the material in response to a selected electrical input signal.

In one embodiment of the present invention, the volume of memory material defining a single-cell memory element may have a dynamic range of resistance which provides for two distinct detectable levels of electrical resistance values, thereby providing for single-bit data storage capabilities.

In another embodiment of the present invention, the volume of memory material defining a single-cell memory element may have at least three distinct detectable levels of electrical resistance values and thus be capable of storing more than one bit of binary information, thereby providing the memory element with multibit storage capabilities. Preferably, the volume of memory material defining a single-cell memory element may have at least four distinct detectable levels of electrical resistance values so that the dynamic range and the multibit capabilities provide storage for at least two bits of binary information in a single-cell memory element.

In yet another embodiment of the present invention, the dynamic range of resistance provides for at least sixteen distinct detectable levels of electrical resistance values so that the dynamic range and the multibit capabilities provide storage for at least four bits of binary information in a single-cell memory element.

The phase change memory materials may be formed from a plurality of atomic elements, each of which is present throughout the entire volume of memory material. Preferably, the memory material includes at least one chalcogen element. Preferably, the chalcogen elements are selected from the group consisting of Te, Se, and mixtures or alloys thereof. More preferably, the memory material includes a mixture of Te and Se. The memory material may further include at least one element selected from the group consisting of Ge, Sb, Bi, Pb, Sn, As, S, Si, P, O, and mixtures or alloys thereof. The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof.

It has been determined that compositions in the highly resistive state of the class of TeGeSb materials which meet the criteria of the present invention are generally characterized by substantially reduced concentrations of Te relative to that present in prior art electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 40% to 58% Te. Concentrations of Ge were above about 5% and ranged from a low of about 8% to about 30% average in the material, remaining generally below 50%. The remainder of the principal constituent elements in this composition was Sb. The percentages given are atomic percentages which total 100% of the atoms of the constituent elements. Thus, this composition may be characterized as $Te_aGe_bSb_{100-(a+b)}$. These ternary Te—Ge—Sb alloys are useful starting materials for the development of additional memory materials having even better electrical characteristics.

As discussed above, the memory material of the present invention includes at least one chalcogen and may include at least one transition metal element. The memory materials which include transition metals are elementally modified forms of the memory materials in the Te—Ge—Sb ternary system. That is, the elementally modified memory materials constitute modified forms of the Te—Ge—Sb memory alloys. This elemental modification is achieved by the incorporation of transition metals into the basic Te—Ge—Sb ternary system, with or without an additional chalcogen element, such as Se. Generally the elementally modified memory materials fall into two categories.

The first category is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

The second category is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb, and mixtures or alloys thereof.

The memory elements of the instant patent application possess substantially non-volatile set resistance values. However, if the resistance value does, under some circumstances, drift from its original set value, "compositional modification", described hereinafter, may be used to compensate for this drift. As used herein, the term "non-volatile" will refer to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the volume of memory material to yield substantially stable values of resistance, including the addition of band gap widening elements to increase the inherent resistance of the material. One example of compositional modification is to include graded compositional inhomogeneities with respect to thickness. For example, the volume of memory material may be graded from a first Te—Ge—Sb alloy to a second Te—Ge—Sb alloy of differing composition. The compositional grading may take any form which reduces set resistance value drift and need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of memory material which employ this combination are: (1) a volume of memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated, directly overwritable, single-cell memory element, comprising:
   a phase-change memory material;
   a first electrical contact, said first contact being a first thin-film layer having a sidewall electrically coupled to said memory material; and
   a second electrical contact electrically coupled to said memory material, said second contact spacedly disposed from said first electrical contact,
   wherein said sidewall of said first thin-film layer at least partially encircles said memory material.

2. The memory element of claim 1, wherein said second electrical contact is a second thin-film layer having a sidewall electrically coupled to said memory material.

3. The memory element of claim 1, wherein the height of the sidewall of said first thin-film layer corresponds to the thickness of said first thin-film layer.

4. The memory element of claim 2, wherein the height of the sidewall of said second thin-film layer corresponds to the thickness of said second thin-film layer.

5. The memory element of claim 1, wherein said first thin-film layer and said memory material have an area of contact proportional to the thickness of said first thin-film layer.

6. The memory element of claim 2, wherein said second thin-film layer and said memory material have an area of contact proportional to the thickness of said second conductive layer.

7. The memory element of claim 1, wherein the sidewall of said first thin-film layer being substantially perpendicular to a substrate of said memory element.

8. The memory element of claim 2, wherein the sidewall of said second thin-film layer being substantially perpendicular to a substrate of said memory element.

9. The memory element of claim 1, wherein said phase-change memory material comprises a chalcogen element.

10. The memory element of claim 7, wherein said phase-change memory material comprises a chalcogen element.

11. The memory element of claim 1, wherein a dielectric material is disposed between said first electrical contact and said second electrical contact.

12. The memory element of claim 1, wherein essentially all communication between said first electrical contact and said memory material is through said sidewall of said first thin-film layer.

13. The memory element of claim 2, wherein essentially all communication between said second electrical contact and said memory material is through said sidewall of said second thin-film layer.

14. The memory element of claim 1, wherein said first electrical contact comprises a conductive material.

15. The memory element of claim 1, wherein said second electrical contact comprises a conductive material.

16. The memory element of claim 2, wherein the sidewall of said second thin-film layer at least partially encircles said memory material.

17. The memory element of claim 1, wherein said first thin-film layer has a thickness between 50 Angstroms and 500 Angstroms.

18. The memory element of claim 2, wherein said second thin-film layer has a thickness between 50 Angstroms and 500 Arlgstroms.

19. The memory element of claim 1, wherein said memory element is electrically programmable to at least three resistance values.

20. The memory element of claim 1, wherein said sidewall of said first thin-film layer has a dimension of less than 500 Angstroms.

21. The memory element of claim 20, wherein said dimension is a height of said sidewall of said first thin-film layer.

22. The memory element of claim 2, wherein said sidewall of second thin-film layer has a dimension of less than 500 Angstroms.

23. The memory element of claim 22, wherein said dimension is a height of said sidewall of said second thin-film layer.

24. The memory element of claim 1, wherein said first thin-film layer has a thickness of less than 500 Angstroms.

25. The memory element of claim 2, wherein said second thin-film layer has a thickness of less than 500 Angstroms.

* * * * *